United States Patent
Mclaughlin et al.

(10) Patent No.: US 10,544,313 B2
(45) Date of Patent: Jan. 28, 2020

(54) METHOD AND APPARATUS OF APPLYING LIGHT AND HEAT TO QUANTUM DOTS TO INCREASE QUANTUM YIELD

(71) Applicant: Pacific Light Technologies Corp., Portland, OR (US)

(72) Inventors: Nathan Mclaughlin, Portland, OR (US); Kari N. Haley, Portland, OR (US); Morgan Vonnahme, Beaverton, OR (US); Brian Theobald, Gladstone, OR (US); Norbert Puetz, Ottawa (CA)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 15/425,920

(22) Filed: Feb. 6, 2017

(65) Prior Publication Data

US 2017/0229619 A1    Aug. 10, 2017

Related U.S. Application Data

(60) Provisional application No. 62/291,391, filed on Feb. 4, 2016.

(51) Int. Cl.
*C09D 5/22* (2006.01)
*C09K 11/02* (2006.01)
(Continued)

(52) U.S. Cl.
CPC .............. *C09D 5/22* (2013.01); *C09K 11/025* (2013.01); *B82Y 20/00* (2013.01); *B82Y 40/00* (2013.01); *C08K 2201/001* (2013.01); *C08K 2201/011* (2013.01); *H01L 2933/0041* (2013.01); *Y10S 977/774* (2013.01); *Y10S 977/892* (2013.01); *Y10S 977/95* (2013.01)

(58) Field of Classification Search
CPC .................. H01L 31/035218; H01L 51/502
See application file for complete search history.

(56) References Cited

U.S. PATENT DOCUMENTS

10,351,767 B2 *   7/2019   Daniels .................. B01J 2/003
2014/0022779 A1   1/2014   Su et al.
(Continued)

FOREIGN PATENT DOCUMENTS

JP    2009040633 A    2/2009
JP    2009161642 A    7/2009
(Continued)

OTHER PUBLICATIONS

International Search Report and Written Opinion from PCT/US2017/016734 dated May 17, 2017, 15 pgs.
(Continued)

*Primary Examiner* — Zandra V Smith
*Assistant Examiner* — Andre C Stevenson
(74) *Attorney, Agent, or Firm* — Elliott, Ostrander & Preston, P.C.

(57) ABSTRACT

A method of increasing photo-luminescent quantum yield (PLQY) of QDs to be used as down-converters placed directly on an LED chip includes synthesizing a plurality of quantum dots, applying energy to the plurality of quantum dots to increase PLQY of the plurality of quantum dots, dispensing the plurality of quantum dots onto the LED chip, and curing the LED chip.

19 Claims, 19 Drawing Sheets

(51) Int. Cl.
*B82Y 40/00* (2011.01)
*B82Y 20/00* (2011.01)

(56) References Cited

U.S. PATENT DOCUMENTS

| | | | |
|---|---|---|---|
| 2014/0046083 A1* | 2/2014 | Tilyou | B32B 5/16 |
| | | | 556/19 |
| 2014/0049155 A1 | 2/2014 | Kurtin | |
| 2015/0203747 A1* | 7/2015 | Haley | H01L 33/502 |
| | | | 257/98 |
| 2017/0029697 A1* | 2/2017 | Ghosh | C09K 11/883 |
| 2018/0016495 A1* | 1/2018 | Kim | C09K 11/7492 |

FOREIGN PATENT DOCUMENTS

| | | |
|---|---|---|
| JP | 2010031115 A | 2/2010 |
| JP | 2011178645 A | 9/2011 |
| KR | 10-2014-0090070 | 7/2014 |

OTHER PUBLICATIONS

Notice of Reasons for Rejection for Japanese Patent Application No. 2018-540753, dated Jul. 2, 2019, 7 pages.
Notice of Reasons for Rejection for Japanese Patent Application No. 2018-540753, dated Jul. 2, 2019, 9 pages

* cited by examiner

METHOD AND APPARATUS OF APPLYING LIGHT AND HEAT TO QUANTUM DOTS TO INCREASE QUANTUM YIELD

CROSS-REFERENCE TO RELATED APPLICATIONS

This application claims the benefit of U.S. Provisional Application No. 62/291,391, filed Feb. 4, 2016, the entire contents of which are hereby incorporated by reference herein.

BACKGROUND

Newly manufactured quantum dots (QDs) typically have very high photo-luminescent quantum yield (PLQY, or simply, "quantum yield") when measured at low concentrations with the native ligands from the synthesis of the materials still remaining on the surface. However, quantum yield typically decreases when the quantum dots are processed further, for example, into devices such as LEDs, where they may be used as the down converter component. For example, according to one method for fabricating LED packages, quantum dots are formed, and then an insulator layer is added that encapsulates each quantum dot for stability. The encapsulated quantum dots are then incorporated into a polymer slurry, and the slurry is dispensed into LED devices and cured. After curing, the PLQY may be measured. During this process, if there is no "brightening" step, the quantum yield of the quantum dots may decrease by over 50% compared to the quantum yield of the quantum dots prior to their incorporation into the LED devices. The quantum yield, however, substantially recovers during the initial hours of operation of the LED devices. This presents a problem for the customer (e.g., an LED manufacturer) who receives an LED device: the customer needs to operate the LED device for a period of time before the quantum yield reaches target specifications. FIG. 12A is a graph of the change in PLQY of quantum dots as they are brightened by "burning in" the LED device, at different flux densities and temperatures, for time frames up to 10 hours. No other brightening steps were used. Brightening in this way requires a considerable period of time for burn-in prior to use of the LED devices. FIG. 12B is a graph of the change in the red photon output of LED devices incorporating quantum dots (in this case red photons, as the quantum dots used were emitting in the red part of the spectrum) as they are tracked in an integrating sphere. Prior to measuring these devices, they are exposed to various external light flux densities (but no heating), with higher flux densities resulting in larger degrees of brightening, and no heating. This shows that exposure to external light prior to measurement increases the red output and decreases the transient in the red output measurement.

It is appreciated that QD PLQY varies for different conditions and can change over time in the presence of heat and/or light. Other prior art solutions have been proposed involving altering the ligands present at the QD surface as well as sealing the QDs in an optic so that the QDs' local environment is preserved and there is no further shifting of the quantum yield after the optic is made. However, for QDs used as down converters directly on an LED chip, a sealed optic is not possible, and ligand modifications can have a detrimental effect on the long-term device reliability. What is needed is a method for improving QD PLQY without requiring hours of running the LED devices into which they are incorporated.

SUMMARY

A method and apparatus is described for increasing photo-luminescent quantum yield (PLQY) of quantum dots (QDs), such as QDs to be used as down-converters placed directly on an LED chip in an LED device. Embodiments involve synthesizing a plurality of quantum dots, storing the plurality of quantum dots in solution or in powder form, mixing the quantum dots with a polymer, applying energy to the plurality of quantum dots to increase PLQY of the plurality of quantum dots, dispensing the mixture of quantum dots onto the LED chip, and curing the mixture on the LED chip.

DETAILED DESCRIPTION

Embodiments of the invention relate to a process of applying light and/or heat to quantum dots in various forms in order to substantially increase the quantum yield of the quantum dots. The embodiments work on quantum dots of varying composition, with varying surfaces, in solid or liquid form, and the improvement in quantum yield persists through incorporation into a manufacturing process such as the LED manufacturing process.

Quantum dots are materials which are beneficial in many applications, but which often cannot withstand thousands of hours of operation under the environmental and operating conditions of many products, for example, light emitting diode (LED) or solar devices. According to embodiments of the invention, quantum dots are made robust for certain applications by individually coating the surfaces of the quantum dots with an insulating layer of metal oxide (for example silica, titania, alumina, etc.). An example of quantum dots with an insulator layer is described below with reference to FIGS. 2A-2E and 3A-3C. However, this insulating layer may not be sufficient to protect the quantum dots in all operating or environmental conditions, due to the imperfect or porous coverage of the metal oxide. Adding another layer of metal oxide or other insulating material makes the quantum dots more robust, and thermally stable, by further protecting the surfaces and filling in any imperfections or pores.

Figure 1:
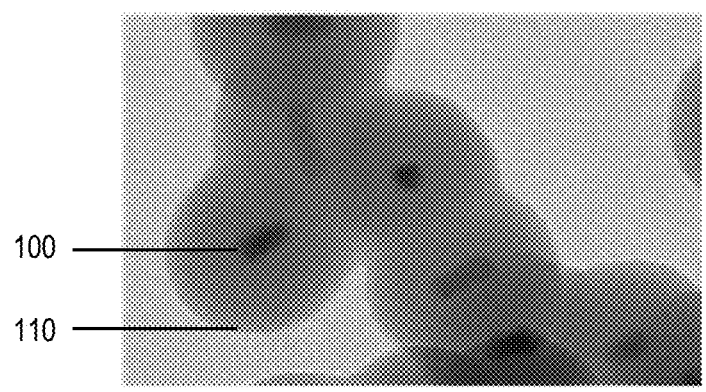
FIG. 1 is an image from a Transmission Electron Microscope (TEM) of a quantum dot coated with an insulator layer according to an embodiment of the invention.

Additionally, in order to ensure that there is no self-quenching of photoluminescence or other interactions between or among quantum dots, in one embodiment, the first insulating layer serves as an adjustable spacer that allows the quantum dots to remain fully dispersed and spaced apart prior to adding a second insulating layer. By adding a metal oxide insulating layer by a reverse micelle or similar process, the individual quantum dots 100 are coated with enough material 110 to ensure adequate monodispersity, as seen in the Transmission Electron Microscope (TEM) image in FIG. 1, and avoid self-quenching.

In embodiments of the present invention, new methods are used to coat core/shell quantum dots with an insulating layer comprising materials including silica and other ligands to provide a structure having a high PLQY, high photostability, and excellent processibility. The insulating layer coating is applied using varying versions of sol-gel processing methods, all of which encapsulate each quantum dot individually into insulating layers, resulting in a very stable population of high performance quantum dot particles.

In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. Additional nanocrystalline shells may also be formed that surround the core/shell pairing. An insulator layer encapsulates, e.g., coats, the nanocrystalline shell(s) and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell(s) form a quantum dot.

In any case, the insulator layer may individually encapsulate each nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference to the above described coated nanocrystalline core and nanocrystalline shell(s) pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer.

With reference again to the above described coated nanocrystalline core and nanocrystalline shell pairings, in an embodiment, the insulator layer comprises a layer of material such as, but not limited to, silica (SiOx), titanium oxide (TiOx), zirconium oxide (ZrOx), alumina (AlOx), or hafnia (HfOx). In one such embodiment, the layer is silica having a thickness approximately in the range of 3-500 nanometers. In an embodiment, the insulator layer is an amorphous layer.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand functionalized with a ligand such as, but not limited to, mono-, di-, or tri-alkoxysilanes with three, two or one inert or organofunctional substituents of the general formula (R1O)3SiR2; (R1O)2SiR2R3; (R1O)SiR2R3R4, where R1 is methyl, ethyl, propyl, isopropyl, or butyl, R2, R3 and R4 are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure (R1O)3Si—(CH2)n-R—(CH2)n-Si(RO)3 where R and R1 is H or an organic substituent selected from the group consisting of alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, or an azasilane.

In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes (MeO)3 SiAllyl, (MeO)3SiVinyl, (MeO)2SiMeVinyl, (EtO)3SiVinyl, EtOSi(Vinyl)3, mono-methoxy silanes, chloro-silanes, or 1,2-bis-(triethoxysilyl)ethane.

In any case, in an embodiment, the outer surface of the insulator layer is ligand-functionalized to impart solubility, dispersability, heat stability, photo-stability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-6 nanometers. The nanocrystalline shell has a long axis and a short axis, the long axis having a length approximately in the range of 6-40 nanometers, and the short axis having a length approximately in the range of 1-10 nanometers greater than the diameter of the nanocrystalline core. The insulator layer has a thickness approximately in the range of 1-50 nanometers along an axis co-axial with the long axis and has a thickness approximately in the range of 3-50 nanometers along an axis co-axial with the short axis. In other embodiments, the thickness of the insulator layer may be greater than 50 nanometers, for example, up to 500 nanometers.

A lighting apparatus may include a light emitting diode and a plurality of semiconductor structures that, for example, act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. An insulator layer encapsulates each quantum dot.

Figure 2A:
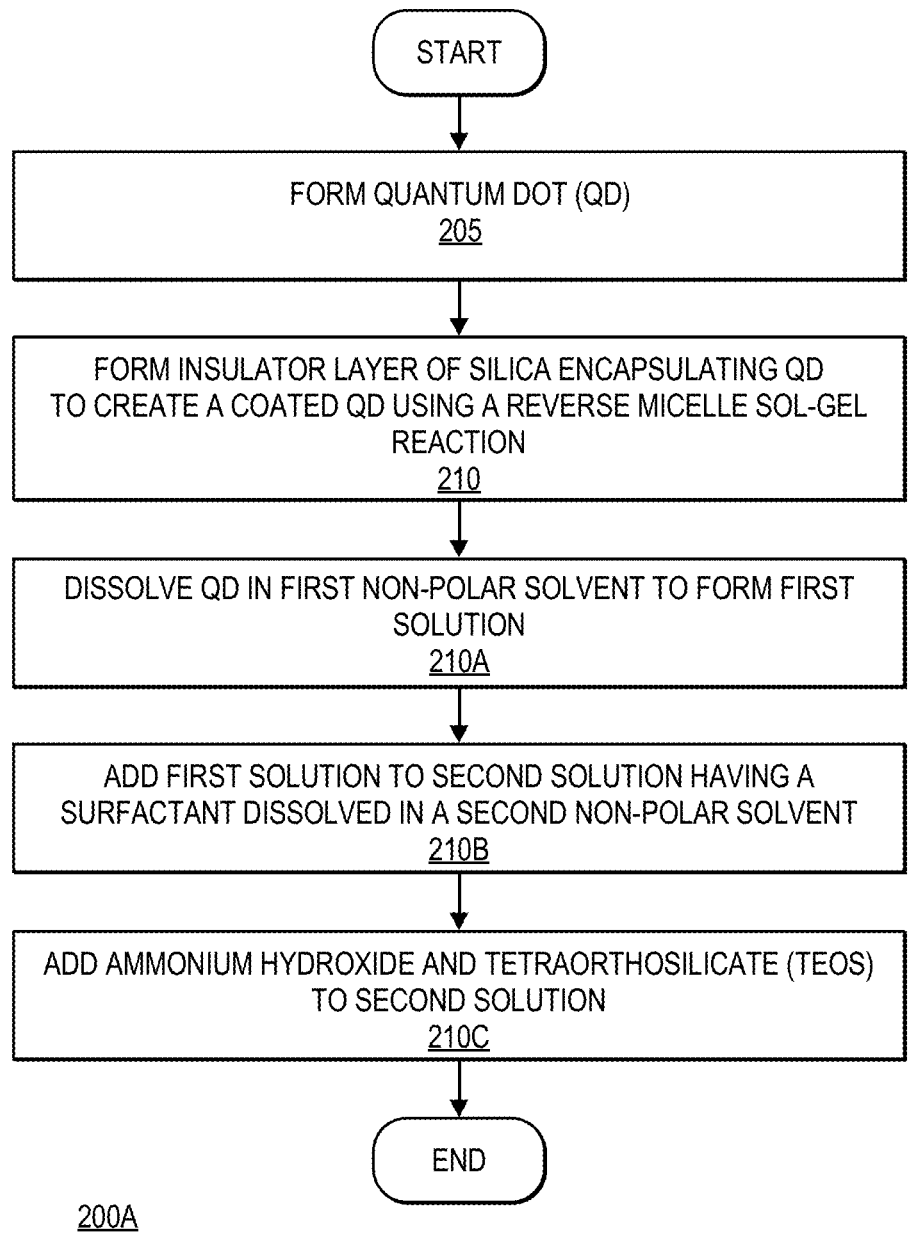
FIG. 2A is a method of forming an insulator layer encapsulating a quantum dot according to an embodiment of the invention.
Figure 2B:
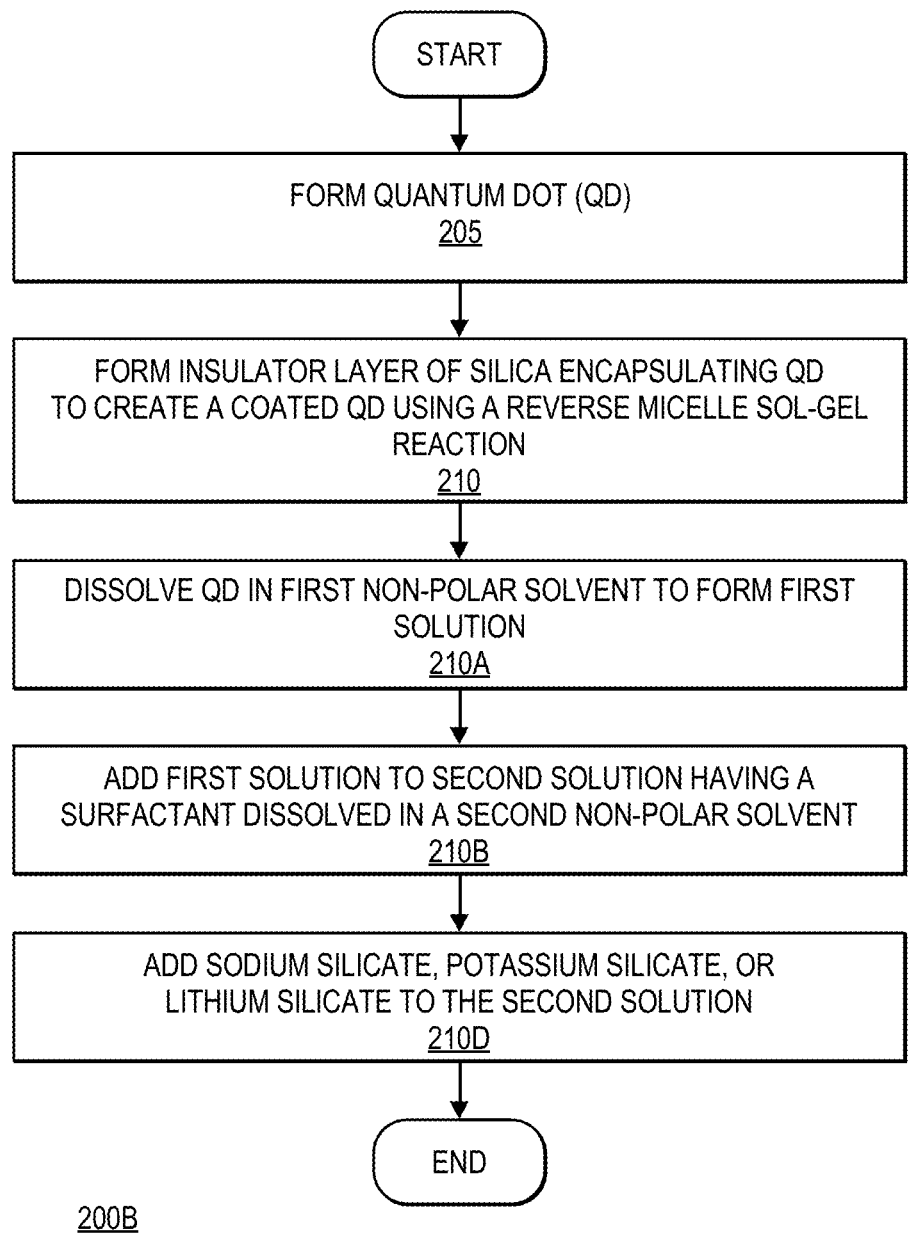
FIG. 2B is a method of forming an insulator layer encapsulating a quantum dot according to another embodiment of the invention.

As described briefly above, and with respect to FIG. 2A, according to embodiment 200A, a quantum dot is formed 205 as described above, including, for example, at least one nanocrystalline shell and anisotropic nanocrystalline core. Then at 210 an insulator layer may be formed to encapsulate a quantum dot structure. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution at 210A. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent at 210B. Subsequently, ammonium hydroxide and tetraorthosilicate (TEOS) are added to the second solution at 210C.

Figure 3A:
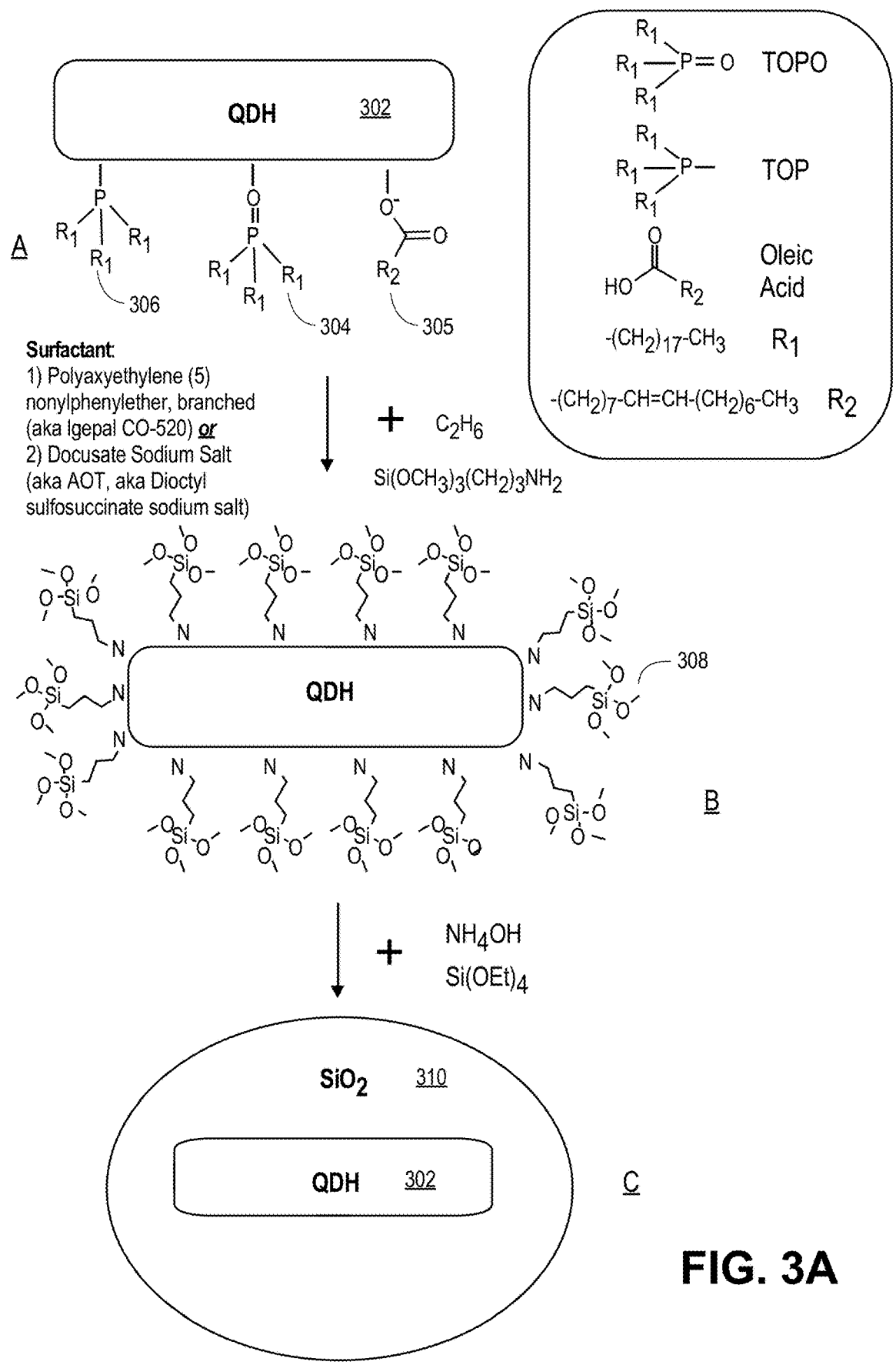
FIG. 3A is a flow diagram in accordance with an embodiment of the invention.

Thus, semiconductor nanocrystals coated with silica according to the present invention may be made by a sol-gel reaction such as a reverse micelle method. As an example, FIG. 3A illustrates operations in a reverse micelle approach to coating a semiconductor structure, in accordance with an embodiment of the present invention. Referring to part A of FIG. 3A, a quantum dot heterostructure (QDH) 302 (e.g., a nanocrystalline core/shell pairing) has attached thereto one or more of TOPO ligands 304, TOP ligands 306, and Oleic Acid 305. Referring to part B, the plurality of TOPO ligands 304, TOP ligands 306, and Oleic acid 305 are exchanged with a plurality of Si(OCH3)3(CH2)3NH2 ligands 308. The structure of part B is then reacted with TEOS (Si(OEt)4) and ammonium hydroxide (NH4OH) to form a silica coating 310 surrounding the QDH 302, as depicted in part C of FIG. 3A.

Silica Coating in Non-Polar Solvent Using Sodium Silicate, Potassium Silicate or Lithium Silicate as Silica Precursor. With respect to FIG. 2B, according to embodiment 200B, a quantum dot is formed 205 as described above, including, for example, at least one nanocrystalline shell and anisotropic nanocrystalline core. Then at 210 an insulator layer is formed to encapsulate the quantum dot structure. For example, in an embodiment, a layer of silica is formed using a reverse micelle sol-gel reaction. According to embodiment 200B, instead of TEOS, Sodium silicate, Na2SiO3, also known as waterglass, can be used to prepare a silica coating. Sodium silicate, waterglass, is an inorganic compound that readily dissolves in water. Waterglass is synthesized commercially by reacting quartz sand with sodium hydroxide and/or sodium carbonate at elevated temperature and pressure. Given the wide abundance and inexpensive nature of these reactants, waterglass is perhaps the least expensive industrial silica source. The polar nature of the molecule (Si—O and Na+ ion pairs) on one hand makes it dissolve easily in water and on the other hand prevents the spontaneous formation of larger silica polycondensates or gelation due to electrostatic effects. In addition, it is easy to handle and unlike silicon alkoxides such as TEOS or TMOS, poses no flammability hazard. It is also chemically stable long-term under standard conditions of use and storage. Hence, this type of precursor combines most of the key advantages for the preparation of silica gels at an industrial scale.

Similar to alkoxide precursor-based silica gels, gelation of waterglass can be induced directly in a single step process by a simple neutralization or in a more elaborate two-step process (acidification/ion exchange followed by base addition).

In a two-step waterglass process, the sol used to prepare the gels consists of silicic acid (H2SiO3) and its oligomers polysilicic acids, which are produced by exchanging Na+ ions from the sodium silicate with H+. To remove sodium ions in the sodium silicate solution, a dilute sodium silicate solution is passed through a strongly acidic, cationic ion-exchange resin (e.g., Amberlyst). The pH of the native sodium silicate solution is above 11.5, but once passed through the ion exchange resin drops into the acidic range with typical values around 2.5. Following the ion exchange step, catalytic amounts of base, e.g., ammonium hydroxide (NH4OH), are added to induce gelation.

In the embodiment 200B, using the reverse micelle sol-gel reaction includes dissolving the quantum dots in a first non-polar solvent to form a first solution at 210A. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent at 210B. Subsequently, sodium silicate is added to the second solution to start the gel formation at 210D. In one embodiment, an acid can be added to adjust the pH to an appropriate value to facilitate the gel formation. In another embodiment, potassium silicate is used instead of sodium silicate. In yet another embodiment, lithium silicate is used instead of sodium silicate. In another embodiment, no silane is added to the first solution, but sodium silicate, potassium silicate or lithium silicate is added to the second solution.

Figure 3B:
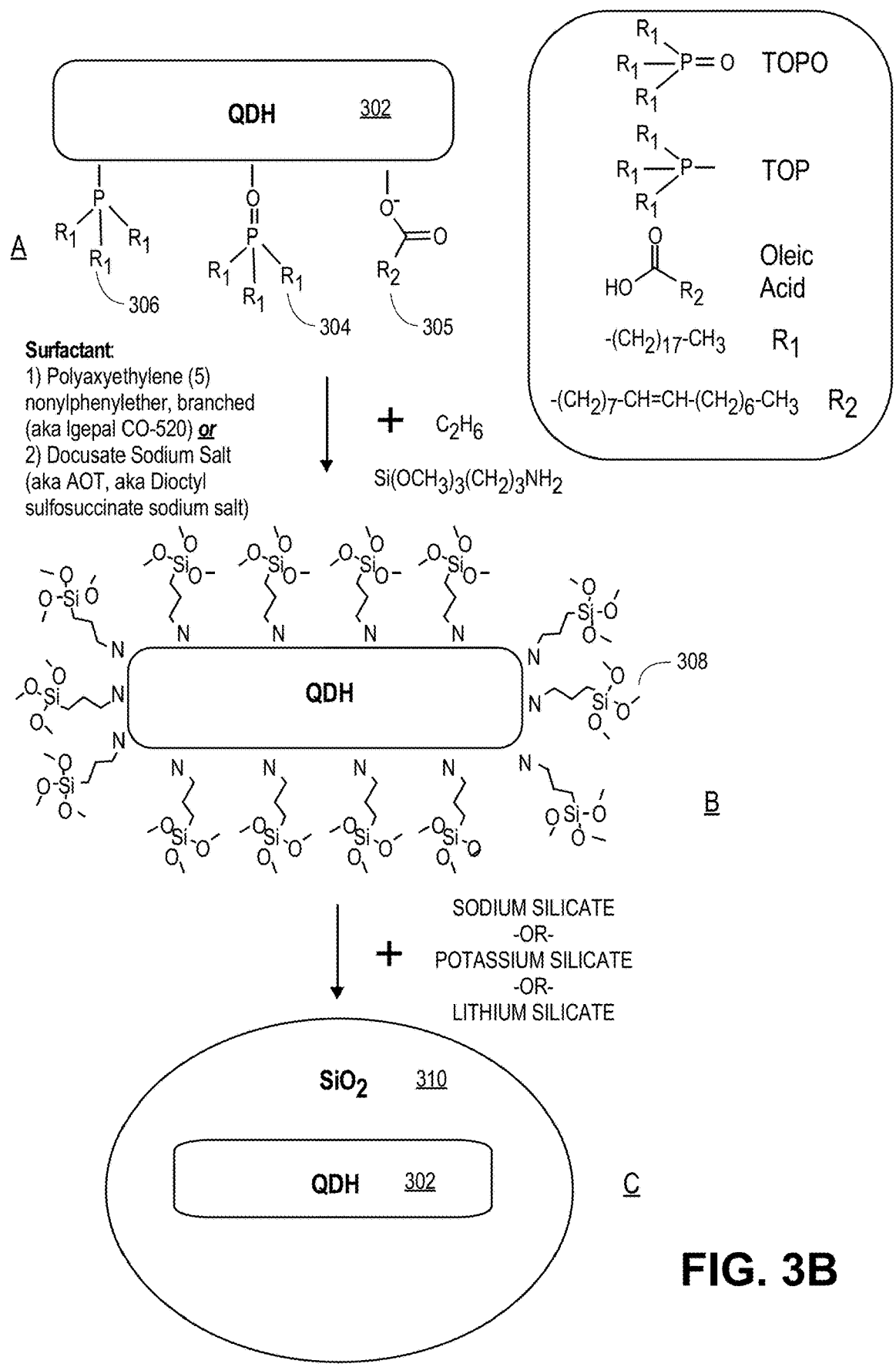
FIG. 3B is a flow diagram in accordance with an embodiment of the invention.

Thus, semiconductor quantum dots coated with silica according to the present invention may be made by a sol-gel reaction such as a reverse micelle method. As an example, FIG. 3B illustrates operations in a reverse micelle approach to coating a semiconductor structure, in accordance with an embodiment of the present invention. Referring to part A of FIG. 3B, a quantum dot heterostructure (QDH) 302 (e.g., a nanocrystalline core/shell pairing) has attached thereto one or more of TOPO ligands 304, TOP ligands 306, and Oleic Acid 305. Referring to part B, the plurality of TOPO ligands 304, TOP ligands 306, and Oleic acid 305 are exchanged with a plurality of Si(OCH3)3(CH2)3NH2 ligands 308. The structure of part B is then reacted with sodium silicate, potassium silicate, or lithium silicate, to form a silica coating 310 surrounding the QDH 302, as depicted in part C of FIG. 3B.

Figure 2C:
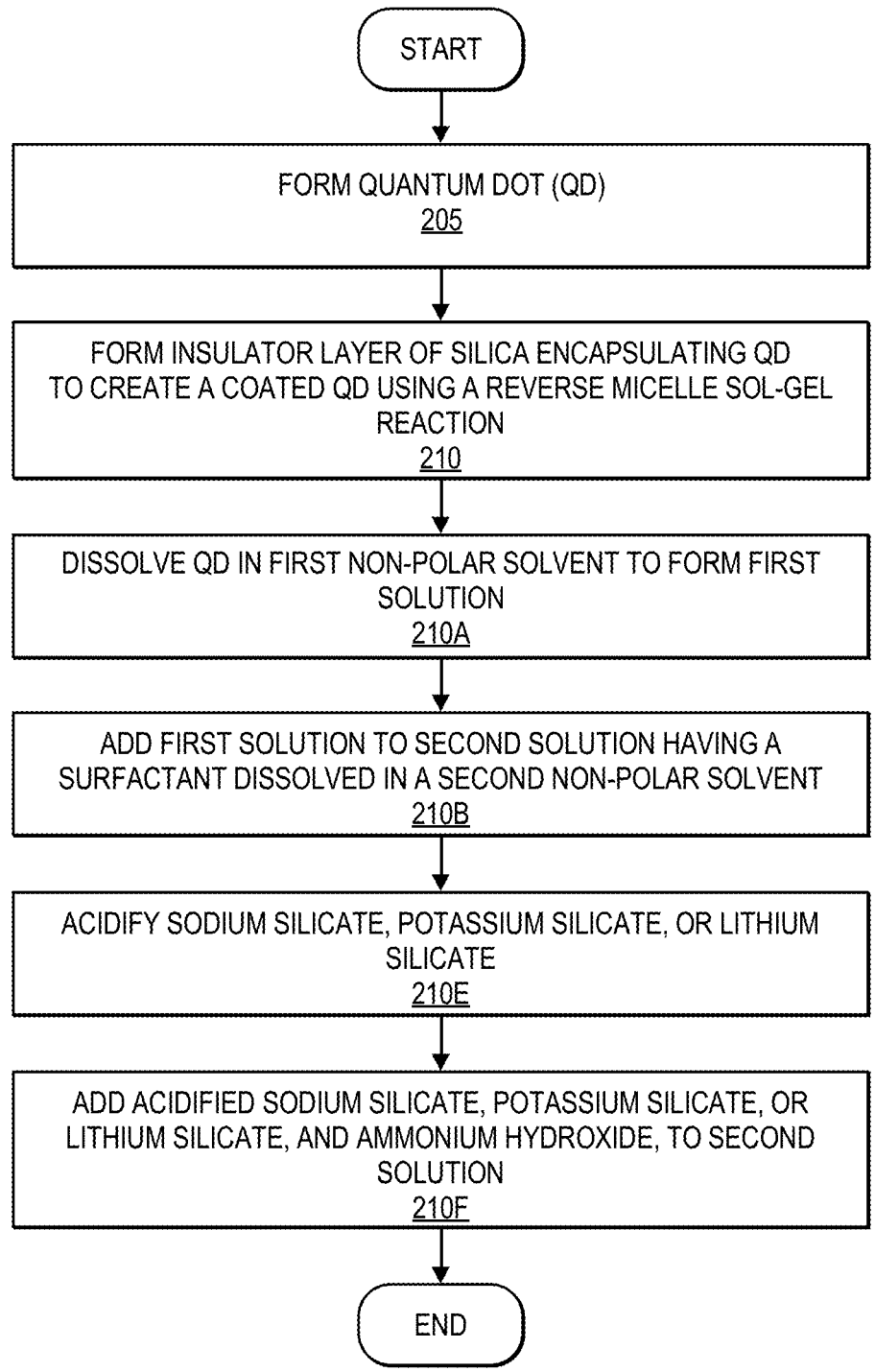
FIG. 2C is a method of forming an insulator layer encapsulating a quantum dot according to yet another embodiment of the invention.
Figure 2D:
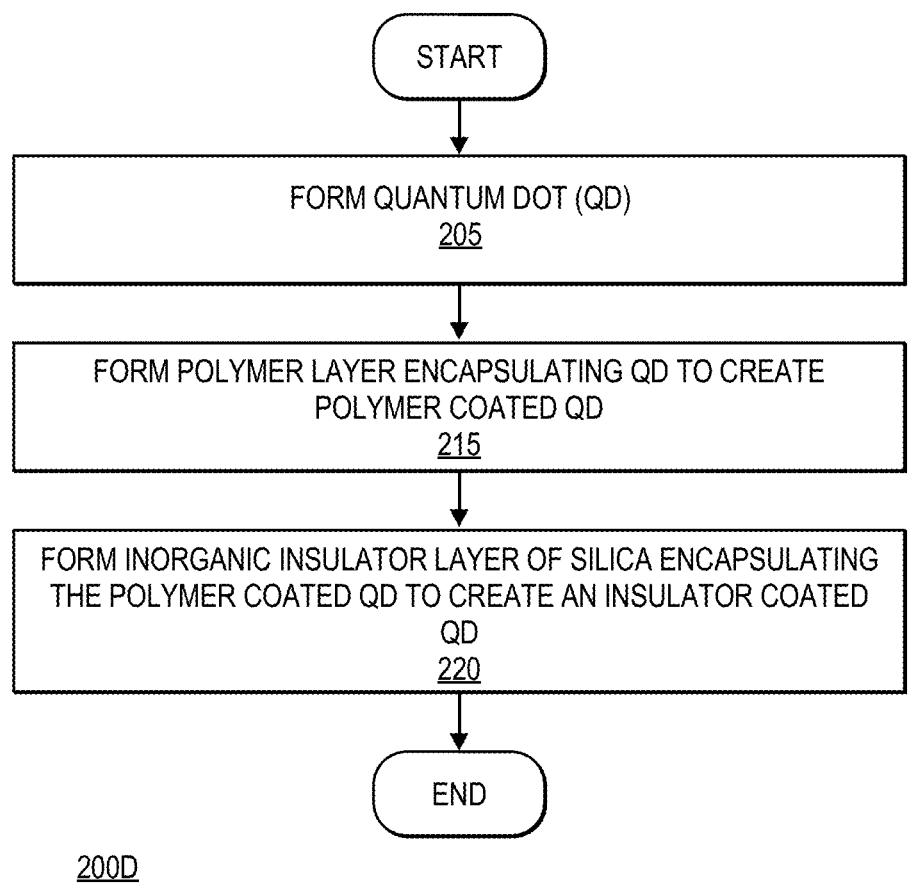
FIG. 2D is a method of forming an insulator layer encapsulating a quantum dot according to an additional embodiment of the invention.
Figure 2E:
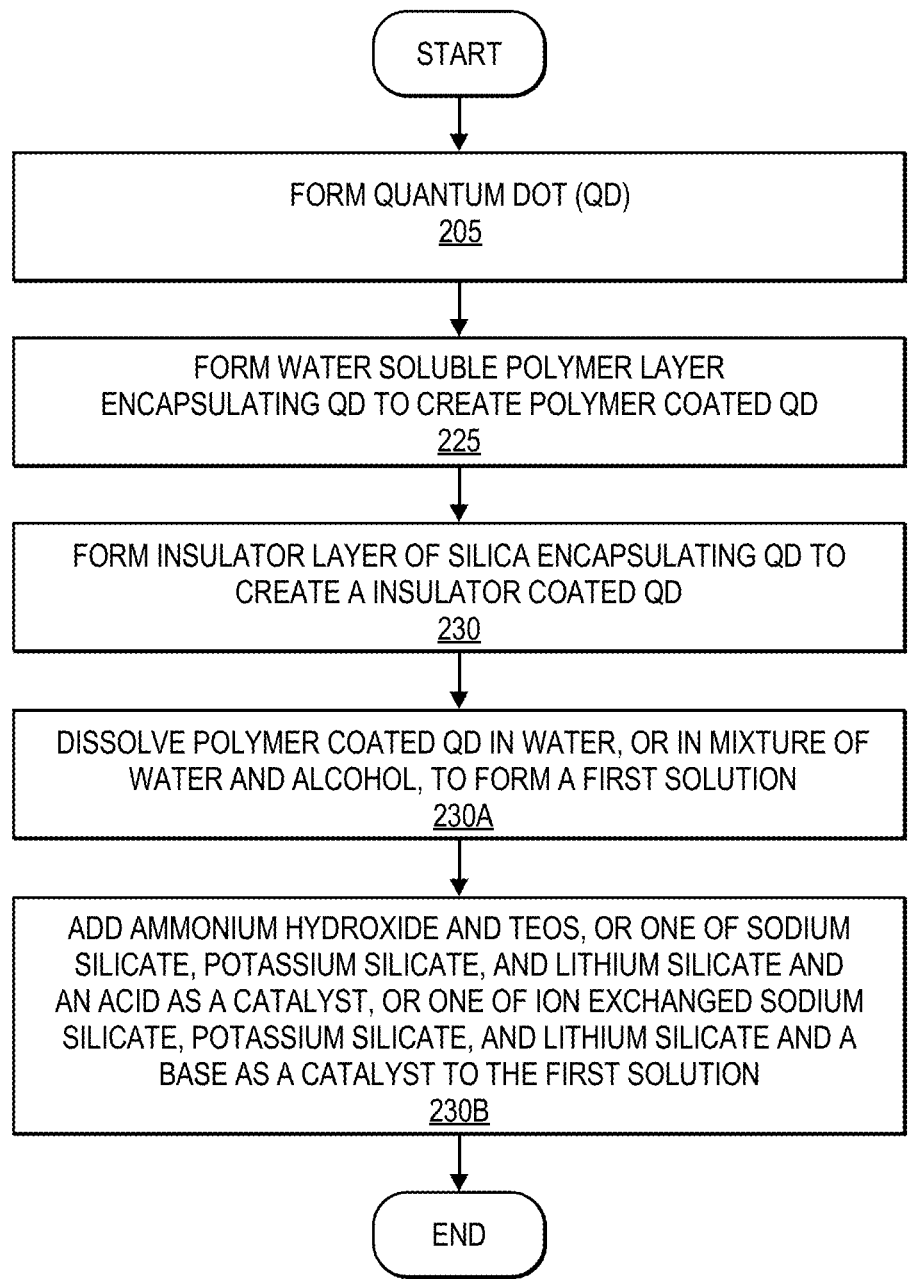
FIG. 2E is a method of forming an insulator layer encapsulating a quantum dot according to a final embodiment of the invention.

With respect to FIG. 2C, according to embodiment 200C, a quantum dot is formed 205 as described above, including, for example, at least one nanocrystalline shell and anisotropic nanocrystalline core. Then at 210 an insulator layer is formed to encapsulate the quantum dot structure. For example, in an embodiment, a layer of silica is formed using a reverse micelle sol-gel reaction. According to embodiment 200C, using the reverse micelle sol-gel reaction includes dissolving the quantum dots in a first non-polar solvent to form a first solution at 210A. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent at 210B. Sodium silicate, potassium silicate or lithium silicate is first acidified by ion exchanging Na+ ions from the sodium silicate with H+ at 210E. The ion exchanged product plus ammonium hydroxide (NH4OH) are added to the second solution to start silica coating at 210F. In another embodiment, no silane is added to the first solution, but acidified sodium silicate, potassium silicate or lithium silicate and ammonium hydroxide are added to the second solution.

Figure 3C:
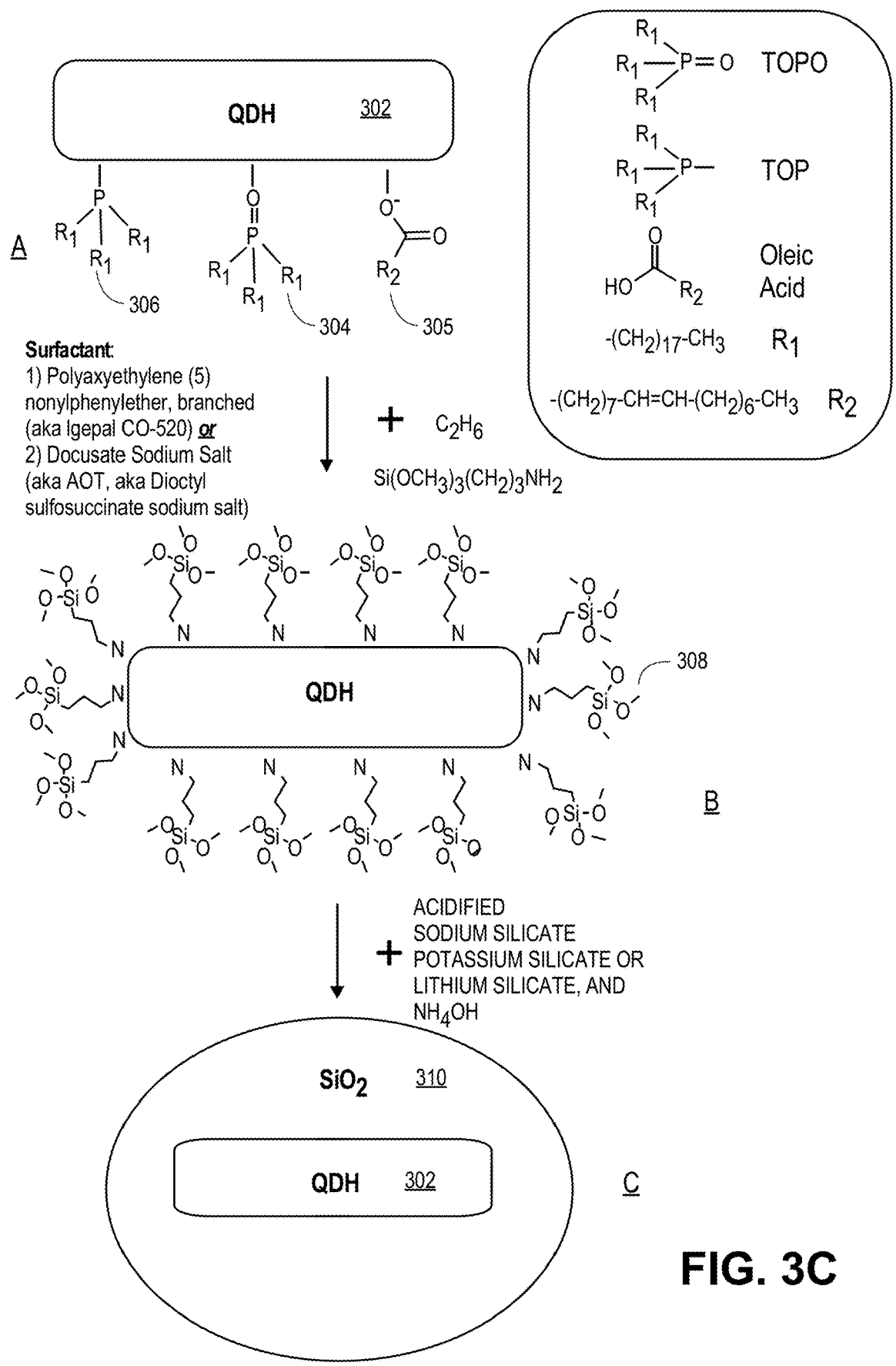
FIG. 3C is a flow diagram in accordance with an embodiment of the invention.

Thus, semiconductor quantum dots coated with silica according to the present invention may be made by a sol-gel reaction such as a reverse micelle method. As an example, FIG. 3C illustrates operations in a reverse micelle approach to coating a semiconductor structure, in accordance with an embodiment of the present invention. Referring to part A of FIG. 3C, a quantum dot heterostructure (QDH) 302 (e.g., a nanocrystalline core/shell pairing) has attached thereto one or more of TOPO ligands 304, TOP ligands 306, and Oleic Acid 305. Referring to part B, the plurality of TOPO ligands 304, TOP ligands 306, and Oleic acid 305 are exchanged with a plurality of Si(OCH3)3(CH2)3NH2 ligands 308. The structure of part B is then reacted with acidified sodium silicate, potassium silicate, or lithium silicate, and ammonium hydroxide (NH4OH) to form a silica coating 310 surrounding the QDH 302, as depicted in part C of FIG. 3C.

Silica Coating in Non-Polar Solvent Using Polymer Coated Quantum Dots. With respect to FIG. 2D, according to embodiment 200D, a quantum dot is formed 205 as described above, including, for example, at least one nanocrystalline shell and anisotropic nanocrystalline core. Then at 215, quantum dots can be first coated with polymer(s) before silica coating at 220, taking advantage of the various chemical compositions and charges available of the polymer(s). In one embodiment, quantum dots can be first encapsulated with an amphiphilic polymer. The amphiphilic polymer can be a block polymer or a branched polymer that has both hydrophobic and hydrophilic moieties. In another embodiment, quantum dots can also be coated with a hydrophilic polymer via ligand exchange. The hydrophilic polymer can be polyacrylic acid, polyphosphonic acid, polyamines like polyallylamine and polyethylenimine, polythiolates, polyimidizoles or any polymer containing carboxylic, phosphonic acid, thiol, amine and/or imidizole.

An inorganic insulating layer can be grown on the quantum dots coated with polymer at 220. For example, a silica coating can be grown on aforementioned polymer coated quantum dots in a non-polar solvent as described above, using TEOS, sodium silicate, potassium silicate, lithium silicate or acidified metal silicate as precursor with or without the addition of silane in the first solution.

Silica Coating in Polar Solvent Using Polymer Coated Quantum Dots. With respect to FIG. 2E, according to embodiment 200E, a quantum dot is formed 205 as described above, including, for example, at least one nanocrystalline shell and anisotropic nanocrystalline core. Then at 225, a water soluble polymer layer is formed, encapsulating the quantum dot to create a polymer coated quantum dot, before silica coating at 230. At 230, a water soluble polymer coated quantum dot can be coated with an additional insulator layer in a polar solvent or a mixture of polar solvents. In embodiment 200E, polymer coated water soluble quantum dots are dissolved in water. Subsequently, ammonium hydroxide and tetraorthosilicate (TEOS) are added to the solution to grow a silica layer around quantum dots.

In another embodiment, polymer coated water soluble quantum dots are dissolved in water. Subsequently sodium silicate, potassium silicate or lithium silicate is added to the solution to grow a silica layer around quantum dots. An acid can also be added as a catalyst to accelerate the reaction.

In another embodiment, polymer coated water soluble quantum dots are dissolved in water. Subsequently ion exchanged sodium silicate, potassium silicate or lithium silicate is added to the solution to grow a silica layer around quantum dots. A base such as ammonium hydroxide is also added as a catalyst to accelerate the reaction.

In another embodiment, polymer coated water soluble quantum dots are dissolved in a mixture of water and an alcohol (MeOH, EtOH, IPA). Subsequently, ammonium hydroxide and tetraorthosilicate (TEOS) are added to the solution to grow a silica layer around quantum dots.

In another embodiment, polymer coated water soluble quantum dots are dissolved in a mixture of water and an alcohol (MeOH, EtOH, IPA). Subsequently, sodium silicate, potassium silicate, or lithium silicate is added to the solution to grow a silica layer around quantum dots. An acid can also be added as a catalyst to accelerate the reaction.

In another embodiment, polymer coated water soluble quantum dots are dissolved in a mixture of water and an alcohol (MeOH, EtOH, IPA). Subsequently, ion exchanged sodium silicate, potassium silicate, or lithium silicate is added to the solution to grow a silica layer around quantum dots. A base such as ammonium hydroxide is also added as a catalyst to accelerate the reaction.

For all the above-described embodiments relating to growing a silica layer in polar solvent using Polymer coated quantum dots, the appropriate silane usually has a charge opposite to that of the water soluble polymer in order to facilitate the initial growth of the silica layer around quantum dots.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications.

Figure 4:
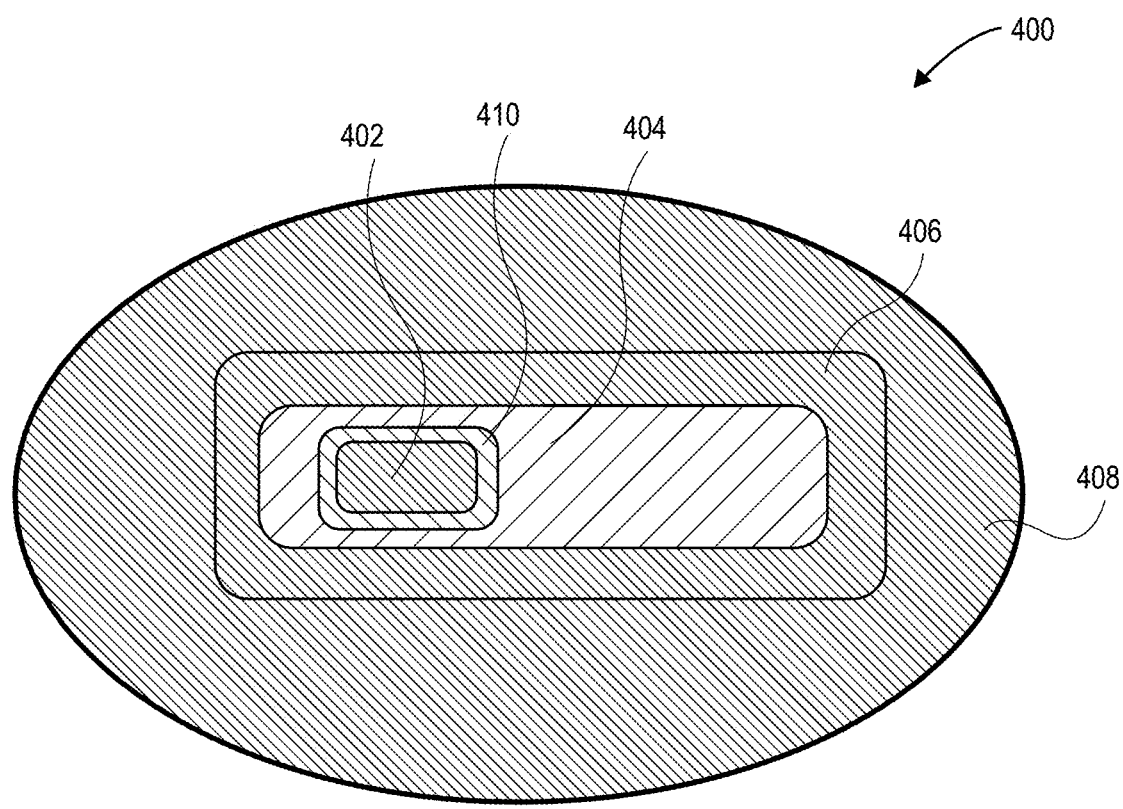
FIG. 4 is an illustration of a semiconductor structure that has a nanocrystalline core and nanocrystalline shell pairing with one compositional transition layer, in accordance with an embodiment of the invention.

In another example, and as illustrated in FIG. 4 below, a semiconductor structure has a nanocrystalline core and nanocrystalline shell pairing with one compositional transition layer, in accordance with an embodiment of the present invention.

Referring to FIG. 4, a semiconductor structure 400 includes a nanocrystalline core 402 composed of a first semiconductor material. A nanocrystalline shell 404 composed of a second, different, semiconductor material at least partially surrounds the nanocrystalline core 402. A compositional transition layer 410 is disposed between, and in contact with, the nanocrystalline core 402 and nanocrystalline shell 404. The compositional transition layer 410 has a composition intermediate to the first and second semiconductor materials.

In an embodiment, the compositional transition layer 410 is an alloyed layer composed of a mixture of the first and second semiconductor materials. In another embodiment, the compositional transition layer 410 is a graded layer composed of a compositional gradient of the first semiconductor material proximate to the nanocrystalline core 402 through to the second semiconductor material proximate to the nanocrystalline shell 404. In either case, in a specific embodiment, the compositional transition layer 410 has a thickness approximately in the range of 1.5-2 monolayers. Exemplary embodiments include a structure 400 where the first semiconductor material is cadmium selenide (CdSe), the second semiconductor material is cadmium sulfide (CdS), and the compositional transition layer 410 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 410 is composed of $Cd_xZn_ySe$, where $0<x<1$ and $0<y<1$.

In an embodiment, the nanocrystalline shell 404 completely surrounds the nanocrystalline core 402, as depicted in FIG. 4. In an alternative embodiment, however, the nanocrystalline shell 404 only partially surrounds the nanocrystalline core 402, exposing a portion of the nanocrystalline core 402. Furthermore, in either case, the nanocrystalline core 402 may be disposed in an asymmetric orientation with respect to the nanocrystalline shell 404. In one or more embodiments, semiconductor structures such as 400 are fabricated to further include a nanocrystalline outer shell 406 at least partially surrounding the nanocrystalline shell 404. The nanocrystalline outer shell 406 may be composed of a third semiconductor material different from the first and second semiconductor materials, i.e., different from the materials of the core 402 and shell 404. The nanocrystalline outer shell 406 may completely surround the nanocrystalline shell 404 or may only partially surround the nanocrystalline shell 404, exposing a portion of the nanocrystalline shell 404. Lastly, an insulator layer 408 encapsulates the shell 406.

In another embodiment, a network of quantum dots may be formed by fusing together the insulator coatings of a plurality of insulator coated quantum dots. For example, in accordance with an embodiment of the present invention, insulator coatings of discrete passivated quantum dots are fused together to form a substantially rigid network of quantum dots where each quantum dot is isolated from other quantum dots in the network by the fused insulator coating. In one such embodiment, fusing together the insulator coatings of discretely passivated quantum dots into a fused network provides improved optical and reliability performance of the resulting structure as compared with the starting discretely passivated quantum dots. In one such embodiment, a chemical base is used to improve the optical performance of silica coated materials by enabling the fusing of the insulator coatings surrounding a plurality of quantum dots. In a specific embodiment, the insulator coating is a silica coating and a base such as potassium hydroxide (KOH) is used to fuse together the silica coatings of a plurality of individually and discretely coated quantum dots. The result is a substantially rigid silica-based network of quantum dots. The amount of base material is scaled with the amount of silica in the reaction. In general, the approaches described herein have important applications for improving the optical and reliability performance of quantum dots or even other phosphor materials having an insulator coating and which are embedded in a matrix. In one such embodiment, the quantum dots or other phosphor materials are first individually coated with one or more insulator layers and then the coated materials are fused to form an insulator network that can be embedded in a matrix. In other embodiments, the insulator network is formed directly on the quantum dots or other phosphor materials.

In an embodiment, then, with respect to using colloidal semiconductor nanocrystals, also known as quantum dots, as downshifting fluorescent materials for LED lighting and/or display technologies, quantum dots are individually coated with a silica insulator layer. The presence of the silica coating improves the performance of the quantum dots when they are subsequently embedded in a polymer film and subjected to various stress tests. Applications include LED lighting applications and/or display configurations. The use of base (such as KOH, NaOH or other similar materials) provides a fused network of the silica coated quantum dots to improve the optical performance of quantum dot materials. As described below, in particular embodiments, the scaling of the amount of KOH or other base with silica content is balanced to achieve optimal performance of the coated/fused quantum dots.

In an embodiment, a method of fabricating a semiconductor structure involves forming a mixture including a plurality of discrete semiconductor quantum dots. Each of the plurality of discrete semiconductor quantum dots is discretely coated by an insulator layer. The method also involves adding a base to the mixture to fuse the insulator layers of each of the plurality of discrete quantum dots, providing an insulator network. Each of the plurality of discrete semiconductor quantum dots is spaced apart from one another by the insulator network. The base may be comprises of, but is not limited to, LiOH, RbOH, CsOH, MgOH, Ca(OH)2, Sr(OH)2, Ba(OH)2, (Me)4NOH, (Et)4NOH, or (Bu)4NOH.

In another embodiment, a method of fabricating a semiconductor structure involves forming a mixture including a plurality of discrete semiconductor quantum dots. Each of the plurality of discrete semiconductor quantum dots is discretely coated by an insulator material. The method also involves adding a base to the mixture to fuse the insulator coating of each of the plurality of discrete nanocrystals, providing an insulator network. Each of the plurality of discrete semiconductor quantum dots is spaced apart from one another by the insulator network. The base may be comprised of, but is not limited to, LiOH, RbOH, CsOH, MgOH, (Me)4NOH, (Et)4NOH, or (Bu)4NOH, and adding the base to the mixture involves adding one mole of the base for every two moles of the insulator material. The method also involves adding free silica to the mixture.

In another embodiment, a method of fabricating a semiconductor structure involves forming a mixture including a plurality of discrete semiconductor quantum dots. Each of the plurality of discrete semiconductor quantum dots is discretely coated by an insulator material. The method also involves adding a base to the mixture to fuse the insulator coating of each of the plurality of discrete quantum dots, providing an insulator network. Each of the plurality of discrete semiconductor quantum dots is spaced apart from one another by the insulator network. The base may be comprised of, but is not limited to, Ca(OH)2, Sr(OH)2 or Ba(OH)2, and adding the base to the mixture involves adding one mole of the base for every four moles of the insulator material. The method also involves adding free silica to the mixture.

In accordance with one or more embodiments herein, an alternative to altering seed size for tuning the emission of a seeded rod emitter architecture is provided. More particularly, instead of changing seed size, the seed composition is changed by alloying either the entire seed (in one embodiment) or some portion of the seed (in another embodiment) with a higher bandgap material. In either case, the general approach can be referred to as an alloying of the seed or nanocrystalline core portion of a heterostructure quantum dot. By alloying the seed or nanocrystalline core, the bandgap can be changed without changing the size of the seed or core. As such, the emission of the seed or core can be changed without changing the size of the seed or core. In one such embodiment, the size of the seed is fixed at the optimum size of a red-emitting seed, or roughly 4 nanometers. The fixed sized means that the size of the rod and the subsequent synthetic operations may not need to be substantially re-optimized or altered as the emission target of the quantum dots is changed.

Accordingly, in one or more embodiments described herein, optimum physical dimensions of a seeded rod are maintained as constant while tuning the emission peak of the heterostructure quantum dot. This can be performed without changing the dimensions of the seed (and therefore the rod) for each emission color. In a particular embodiment, a quantum dot includes an alloyed Group II-VI nanocrystalline core. The quantum dot also includes a Group II-VI nanocrystalline shell composed of a semiconductor material composition different from the alloyed Group II-VI nanocrystalline core. The Group II-VI nanocrystalline shell is bonded to and completely surrounds the alloyed Group II-VI nanocrystalline core. In one such embodiment, the alloyed Group II-VI nanocrystalline core is composed of CdSenS1–n (0<n<1), and the Group II-VI nanocrystalline shell is composed of CdS. In a specific embodiment, the alloyed Group II-VI nanocrystalline core has a shortest diameter of greater than approximately 2 nanometers, and the quantum dot has an exciton peak less than 555 nanometers. In a particular embodiment, the alloyed Group II-VI nanocrystalline core has a shortest diameter of approximately 4 nanometers, and the quantum dot has an exciton peak less than 555 nanometers, as is described in greater detail below Perhaps more generally, in an embodiment, a quantum dot includes a semiconductor nanocrystalline core of arbitrary composition. The quantum dot also includes any number of semiconductor nanocrystalline shell(s). The semiconductor nanocrystalline shell(s) is/are bonded to and completely surrounds the semiconductor nanocrystalline core. In one such embodiment, the semiconductor nanocrystalline core is composed of a first Group II-VI material, and the binary semiconductor nanocrystalline shell is composed of a second, different, Group II-VI material. In one such embodiment, the first Group II–VI material is CdSenS1-n (0<n<1), and the second Group II-VI material is CdS.

One or more embodiments described herein involve fabrication of a semiconductor hetero-structure. The semiconductor hetero-structure has a nano-crystalline core composed of a group semiconductor material. A nano-crystalline shell composed of a second, different, semiconductor material at least partially surrounds the nano-crystalline core. For example, the nano-crystalline shell may be composed of a different group I-III-VI semiconductor material or of a group II-VI semiconductor material.

In one such embodiment, the above described nanocrystalline core/nano-crystalline shell pairing has a photoluminescence quantum yield (PLQY) of greater than approximately 60%. In another, or same, such embodiment, the nano-crystalline core/nano-crystalline shell pairing provides a Type I hetero-structure. One or more embodiments described herein are directed to hetero-structure systems having distinct group I-III-VI material cores. In an exemplary embodiment, a sphere or rod-shaped core/shell quantum dot is fabricated to have a sharp compositional interface between the core and shell or a graded/alloyed interface between core and shell.

Figure 5:
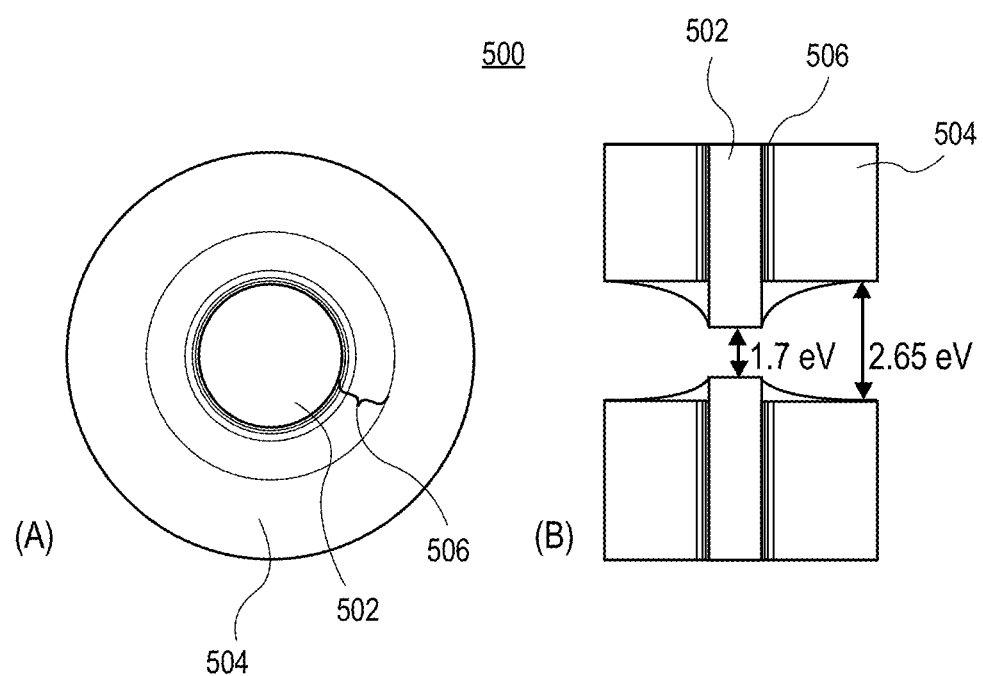
FIG. 5 illustrates a nano-particle in accordance with an embodiment of the invention.

FIG. 5 illustrates an axial cross-sectional view (A) of a spherical nano-particle 500, in accordance with an embodiment of the present invention. Referring to FIG. 5, an alloy region 506 is included between the core 502 and shell 504 of 500. As shown in part (B) of FIG. 5, in one embodiment, the nano-particle 500 demonstrates type I hetero-structure behavior, with excitons preferentially recombining in the core 502 of the nano-crystal 500 due to the smaller, nested bandgap of the seed. Optionally, additional layers of material may be added, including additional epitaxial layers or amorphous inorganic and organic layers. Other suitable embodiments are described below.

In an embodiment, systems described herein include a nano-crystalline core emitter having a direct, bulk band gap approximately in the range of 1-2.5 eV. Exemplary cores include a group I-III-VI semiconductor material based on silver gallium sulfide having a stoichiometry of approximately AgGaS2. In one such embodiment, the nano-crystalline core has a peak emission approximately in the range of 475-575 nanometers.

In one or more embodiments, the nano-crystalline core and nano-crystalline shell pairings described herein have a lattice mismatch of equal to or less than approximately 10%. In some embodiments, less than approximately 6% mismatch is preferable, but up to approximately 10% can be workable. In particular embodiments, the mismatch is less than approximately 4% mismatch, as seen in successful Cd-based systems.

One or more embodiments described herein is directed to a hetero-structure core/shell pairing that is cadmium-free. For example, with reference to the above described nanocrystalline core and nano-crystalline shell pairings, in an embodiment, the first (core) material is a group I-III-VI semiconductor material. In one such embodiment, the second (shell) semiconductor material is a second group I-III-VI material. For example, a suitable I-III-VI/I-III-VI core/shell pairing can include, but is not limited to, copper indium sulfide (CIS)/silver gallium sulfide (AgGaS2), copper indium selenide (CISe)/AgGaS2, copper gallium selenide (CuGaSe2)/copper gallium sulfide (CuGaS2), or CuGaSe2/AgGaS2. In another such embodiment, the second (shell) semiconductor material is a group II-VI material. For example, a suitable I-III-VIII-VI core/shell pairing can include, but is not limited to, copper indium sulfide (CIS)/zinc selenide (ZnSe), CIS/zinc sulfide (ZnS), copper indium selenide (CISe)/ZnSe, CISe/ZnS, copper gallium selenide (CuGaSe2)/ZnSe, CuGaSe2/ZnS, silver gallium sulfide (AgGaS2)/ZnS, AgGaS2/ZnSe, or silver gallium selenide (AgGaSe2)/ZnS, AgGaSe2/ZnSe.

In an embodiment, the semiconductor hetero-structure further includes a nano-crystalline outer shell composed of a third semiconductor material different from the core and shell semiconductor materials. The third semiconductor material at least partially surrounding the nano-crystalline shell and, in one embodiment, the nano-crystalline outer shell completely surrounds the nano-crystalline shell. In a particular embodiment, the second (shell) semiconductor material one such as, but not limited to, zinc selenide (ZnSe), silver gallium sulfide (AgGaS2) or copper gallium sulfide (CuGaS2), and the third (outer shell) semiconductor material is zinc sulfide (ZnS).

While the shape of the core of the quantum dot depicted in FIG. 4 is that of a rod, it is appreciated that the methods described herein are not limited by the shape of the quantum dot and could be applied to coated quantum dots of multiple shapes, including spheres, rods, tetrapods, teardrops, sheets, etc. It is not limited by the composition of the quantum dot and can be applied to quantum dots made from a single material or multiple materials in either a core/shell/optional shell/optional shell configuration or an alloyed composition. The semiconductor materials may be selected from the Group II-VI compounds, Group III-V compounds, group IV-IV compounds, group I-III-VI compounds, or any alloy thereof. More specifically the semiconductor materials may be chosen from ZnO, ZnS, ZnSe, ZnTe, CdO, CdS, CdSe, CdTe, HgS, HgSe, HgTe, HgO, AlN, AlP, AlAs, AlSb, GaN, GaP, GaAs, GaSb, GaSe, InN, InP, InAs, InSb, TlN, TlP, TlAs, TlSb, PbS, PbSe, PbTe, MgO, MgS, MgSe, alloys thereof, and mixtures thereof.

Figure 6:
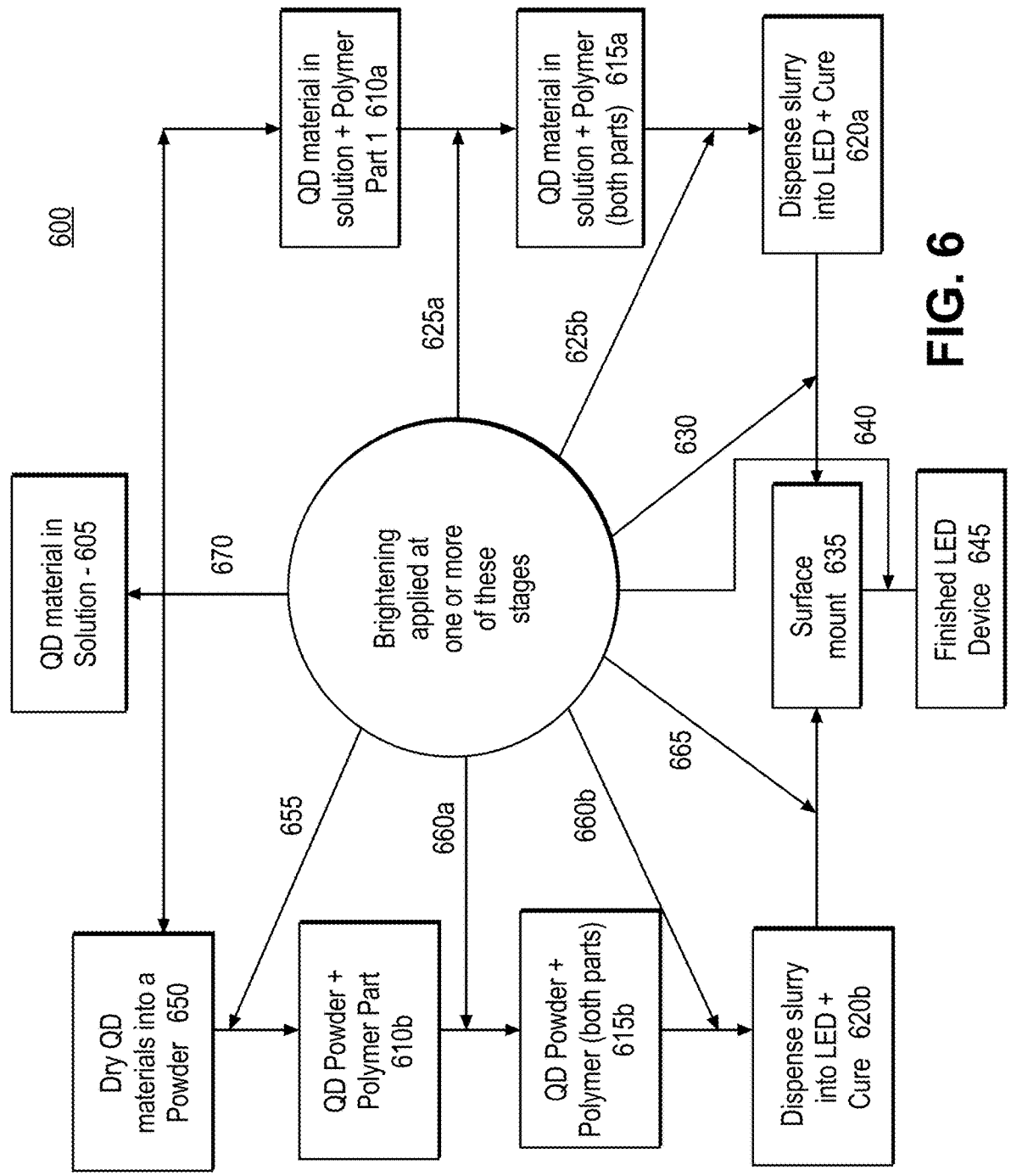
FIG. 6 is a flow diagram in accordance with embodiments of the invention.

According to embodiments of the invention, a "brightening" step can be incorporated during the manufacturing process at any point in time between the time that the quantum dot particles are synthesized and the LED device into which the QDs are incorporated is operated. The brightening step improves the PLQY or quantum yield of the quantum dots. With reference to FIG. 6, the brightening process 600, and variations thereof, are described. Initially, at 605, the QDs are placed in a solution, such as a solvent, directly after synthesis, for storage. The QDs may be brightened at this point in time 670 by applying energy, such as heat, light, or both, before further steps are taken in the LED device manufacturing process. After point in time 670 the QDs may be mixed into one or more parts of a polymer slurry (for example, LEDs may require a two part polymer) at 610a and 615a, and dispensed into the LED device and cured at 620a. The QDs may be brightened in the polymer slurry, at point in time 625a or 625b, after dispense, at point in time 630, or after surface mounting the LED package 635 onto a substrate, such as a printed circuit board (PCB), prior to shipment of the finished LED device 645, at point in time 640.

Alternatively, the QDs in solution at 605 may first be dried into a powder at 650. The drying process is incorporated into mixing of the QDs into one or both parts of the polymer at 610b and 615b, and dispensed and cured at 620b. The QDs in powder form may be brightened at point in time 655, after being mixed into the polymer at points in time 660a or 660b, after dispensing the polymer into an LED and curing, at point in time 665, or after surface mounting of the package but prior to shipment of the finished LED device 645, at point in time 640.

Figure 7:
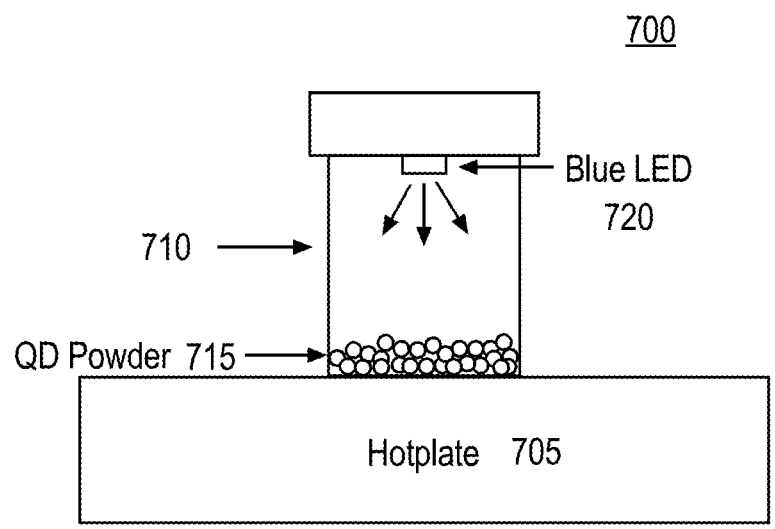
FIG. 7 is an apparatus used in accordance with embodiments of the invention.

With reference to FIG. 7, according to one embodiment, a brightening apparatus 700 performs brightening under a range of conditions. The apparatus 700 includes a heat source, such as a hotplate 705, which can be used to control the temperature inside a container. The container in one embodiment is a glass container 710. QDs in powder form 715 are placed in the container for brightening the QDs, using the heat source. In another embodiment, QDs in solution are placed in the container for brightening the QDs. Additionally or alternatively, a light source, such as an LED (e.g., blue LED 720), or an array of LEDs (not shown), provides light for brightening the QDs. While specific types of heat or light sources are disclosed herein, it is appreciated that other types of heat or light sources may be used without departing from the invention. In one embodiment, a range of brightening temperatures may be selected, for example, a range from 0 to 200 C. In one embodiment, a range of brightening flux densities may be selected, for example, a range from 0 to 1 W/cm$^2$. In one embodiment, a range of brightening durations is selected, for example, a range from 15 minutes to 100 hours. In one embodiment, various combinations of brightening temperature ranges, brightening flux density ranges, and brightening duration ranges, may be used. For example, in one embodiment, a temperature of 150 C and a flux density of 10 W/cm$^2$ is maintained for a time duration of 48 hours, followed by a temperature of 25 C and a flux density of 500 mW/cm$^2$ maintained for a time duration of 100 hours, to brighten the QDs. In one embodiment, the container may be filled with gas. In an alternative embodiment, the container may maintain a vacuum. It is appreciated that the brightening conditions disclosed herein are exemplary, and could be slightly, or substantially, different, such as conducting the brightening in different atmospheres, under vacuum, in the presence of ozone (e.g., a UV-ozone oven), etc.

An apparatus similar to but larger than that shown in FIG. 7 may be used, in one embodiment, to brighten LED chips or LED devices, or arrays thereof, rather than the quantum dots by themselves. That is, brightening, under such an embodiment, is performed with the apparatus after the quantum dots have been dispensed into LED chips or after the LED chips have been surface mounted to a substrate. Brightening of the LED chips or LED devices or arrays, according to one embodiment, occurs for a time period of 8 hours, at a temperature of 100 C and a flux density of 100 mW/cm$^2$.

Figure 8:
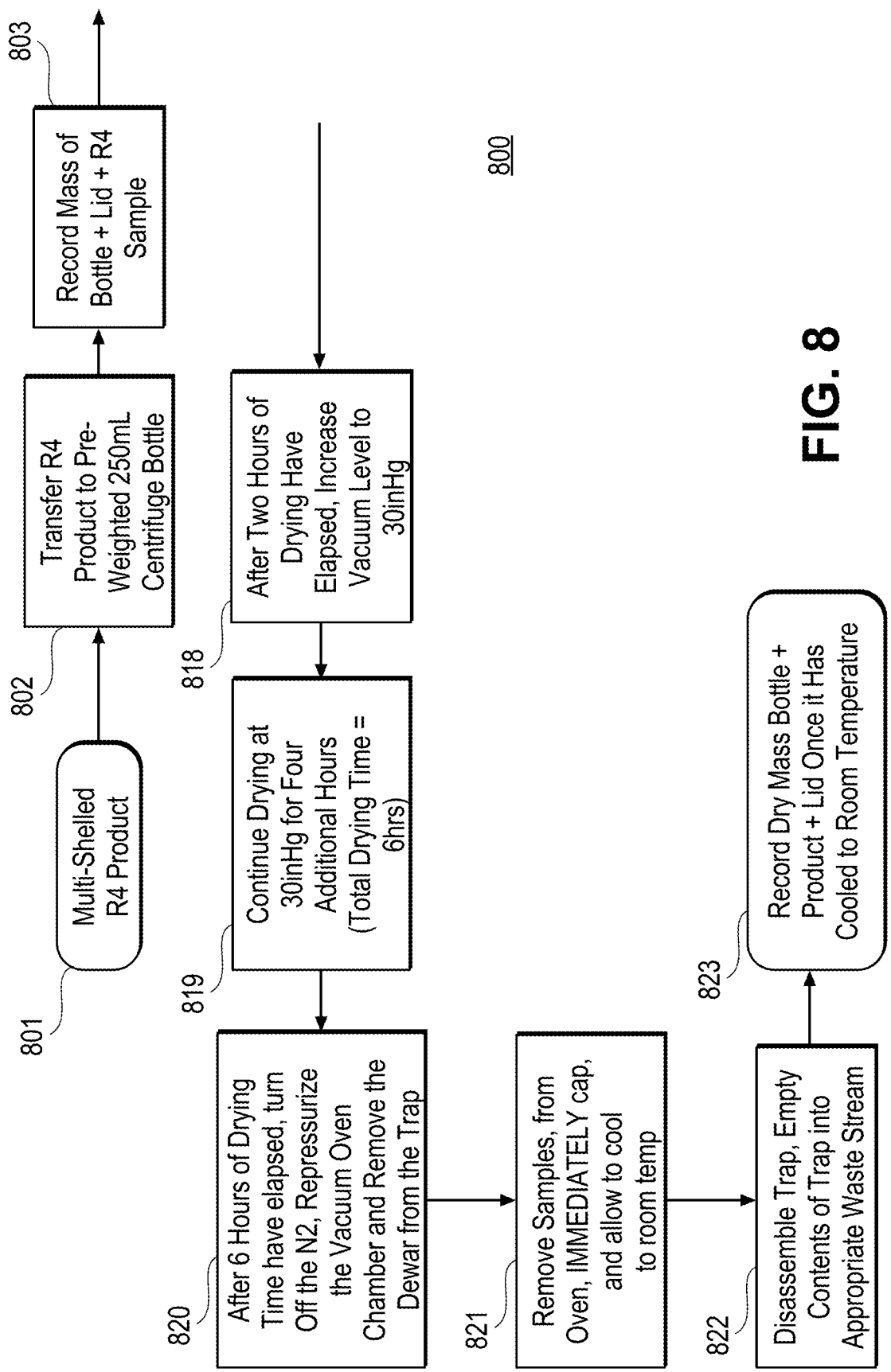
FIG. 8 is a flow diagram of a drying process that produces a sample of quantum dots in powder form.
Figure 8:
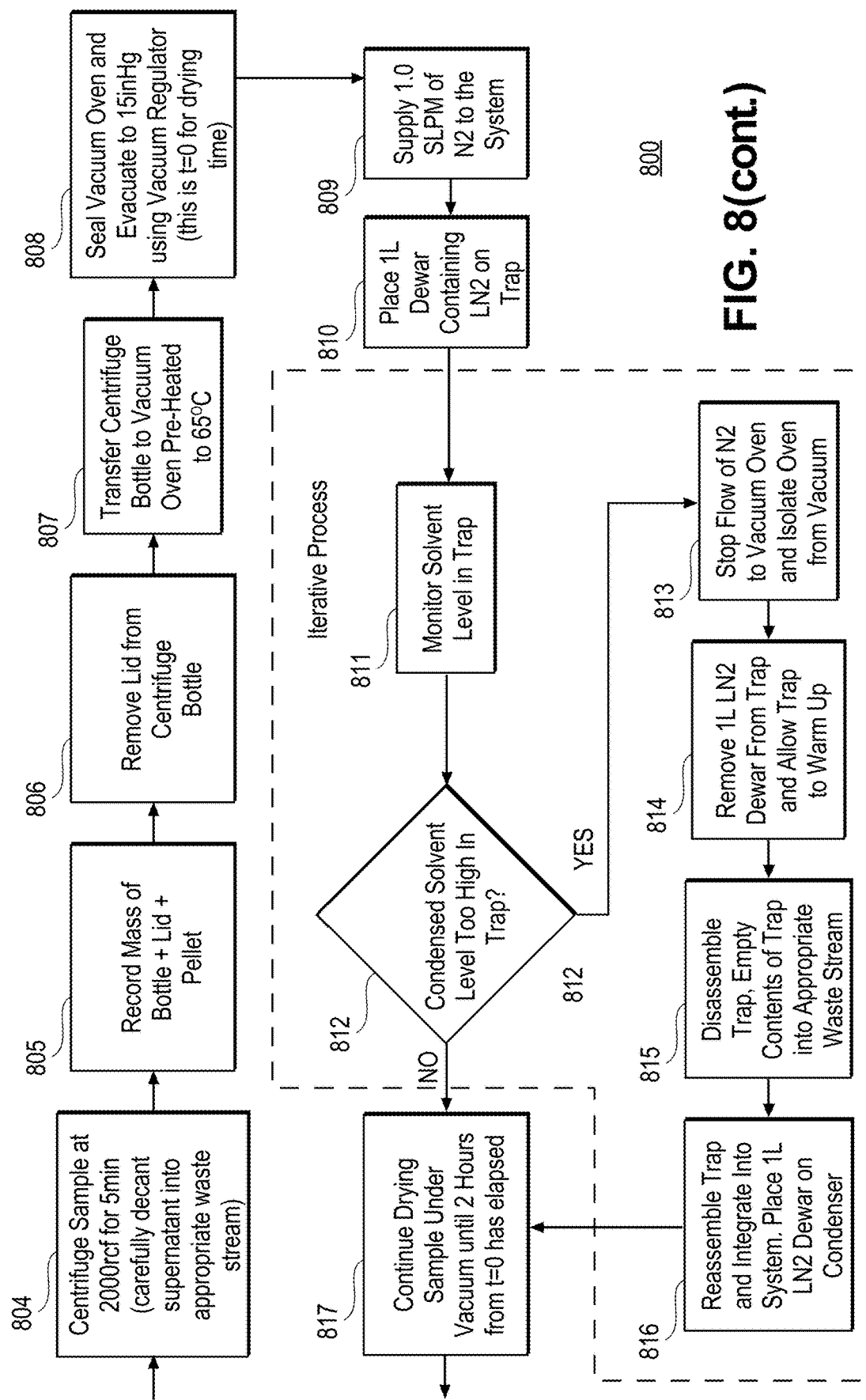

As mentioned above with reference to FIG. 6, in one embodiment, the QDs in a solution at 605 may first be dried into a powder at 650. The drying process is incorporated into the process of mixing the QDs into one or both parts of the polymer at 610b and 615b, and dispensed and cured at 620b. With reference to FIG. 8, the drying process 800 is illustrated, according to an embodiment of the invention. A sample of quantum dots 801 in solution (multi-shelled R4 product) is placed into a centrifuge bottle at 802, the bottle and sample weighed at 803, and then the sample is introduced into a centrifuge. The sample is then subjected to centrifugal force at 804, for example, 2000 relative centrifugal force (rcf) for a period of time, such as 5 minutes. By spinning the sample at very high speed, the components of the solution are subjected to centrifugal force, which causes more dense material to migrate away from the axis of rotation and less dense material move toward it. The dense material—the quantum dots—settles to the bottom of the bottle into a what is known as a pellet, and the remaining solution, the supernatant, is decanted into a waste stream. At 805, the bottle and sample are again weighed, the bottle's lid removed at 806, and the bottle transferred to an oven at 807. In one embodiment, the oven is pre-heated to 65C. In one embodiment, the oven is a vacuum oven. The vacuum oven is sealed at 808 and evacuated to 15 inches of mercury (InHg) using a vacuum regulator. The process is now ready to begin drying the pellet (this is t=0 for drying time).

At 809, nitrogen gas (N2) is supplied to the system, for example, at a volumetric flow rate of 1.0 standard liter per minute (SLPM). Sub-zero cooling occurs next, at 801, in which a flask, such as a 1-liter Dewar flask, containing liquid nitrogen (LN2), is placed on a cold trap at 810. The cold trap is used to condense solvent vapor into a liquid, which is then removed, as part of the drying process. This technique may be referred to as freeze-drying, and the cold trap may be referred to as a condenser.

An iterative portion of the process follows, at steps 811-816, in which the amount of condensed solution or solvent is monitored in the trap at 811, and if the amount of condensed solvent exceeds a threshold at 812, the flow of N2 to the vacuum is halted at 813 and the oven is isolated from the vacuum. Then, the flask is removed from the cold trap and allowed to warm up at 814, at which point the trap is disassembled and the contents of the cold trap emptied into the waste stream at 815. The cold trap is then reassembled and integrated into the system, including placing the flask back on the condenser/cold trap. This iterative portion of the drying process continues until the level of condensed solvent falls below the threshold at 812, and then the process continues to dry the sample under vacuum at 817. In one embodiment, the drying continues under vacuum at 817 until two hours have elapsed from t=0 (set at 808).

After two hours of drying have elapsed, in one embodiment, the vacuum level is increased to 30 InHg at 818. Drying then continues in the vacuum at 30 InHg for an additional period of time, for example, four hours, until total drying time reaches six hours, at 819. At 820, after six hours of drying time have elapsed, the supply of nitrogen gas is stopped, the vacuum chamber in the oven is re-pressurized, and the flask is then removed from the trap.

The centrifuge bottle containing the sample is then removed from the oven at 821. In one embodiment, the lid is immediately placed on the centrifuge bottle, and the sample is allowed to cool to room temperature. The cold trap is then disassembled, and the contents of the trap emptied into the waste stream. The final step in the process, at 823, involves weighing the centrifuge bottle, contents, and lid, as in 803, once the bottle has cooled to room temperature.

Figure 9:
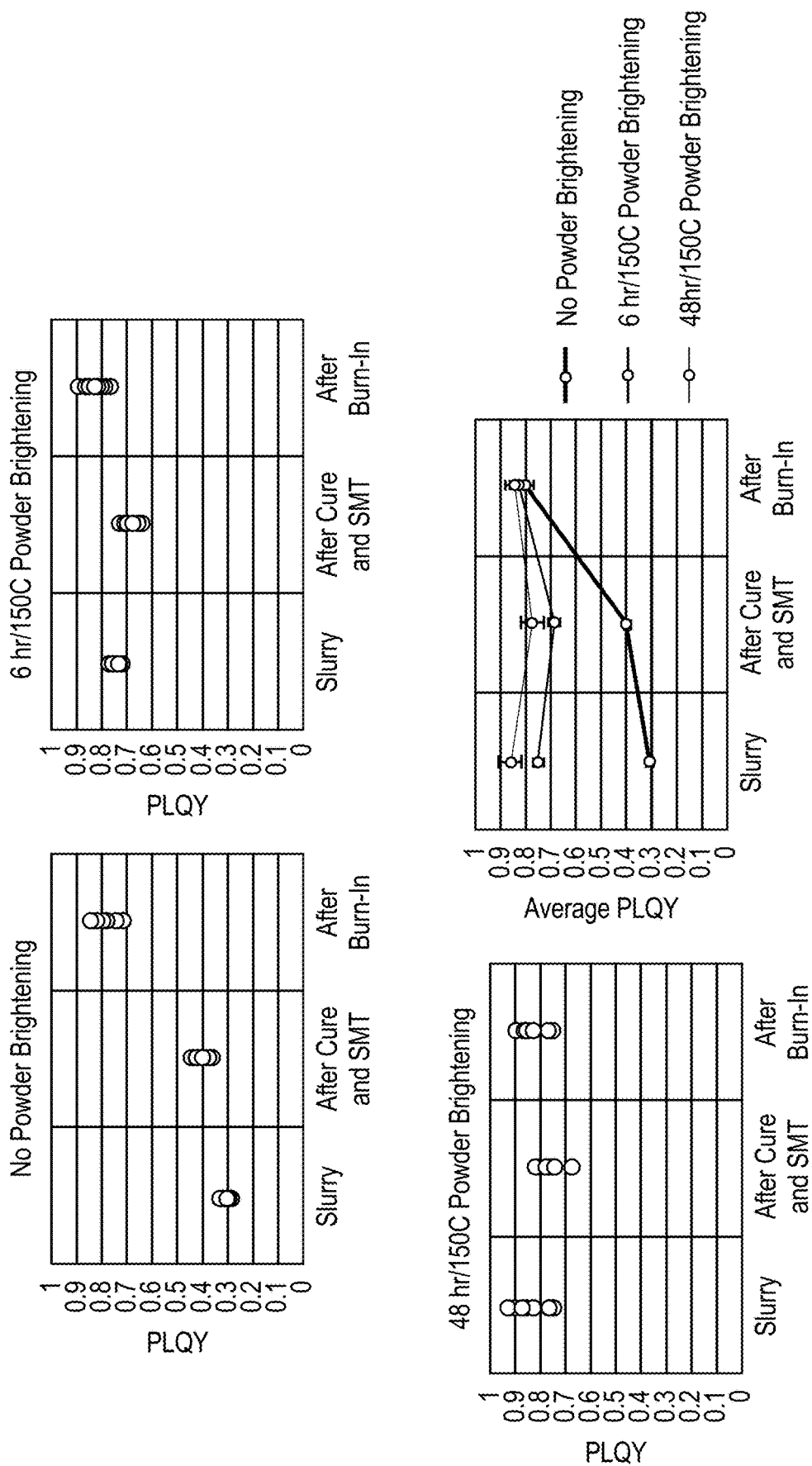
FIG. 9 illustrates correlations and the transfer function for quantum yield when brightening the QDs in the polymer slurry, versus brightening the QDs after curing and surface mounting the LED chips, and after operation of the LED devices ("after burn-in").
Figure 10:
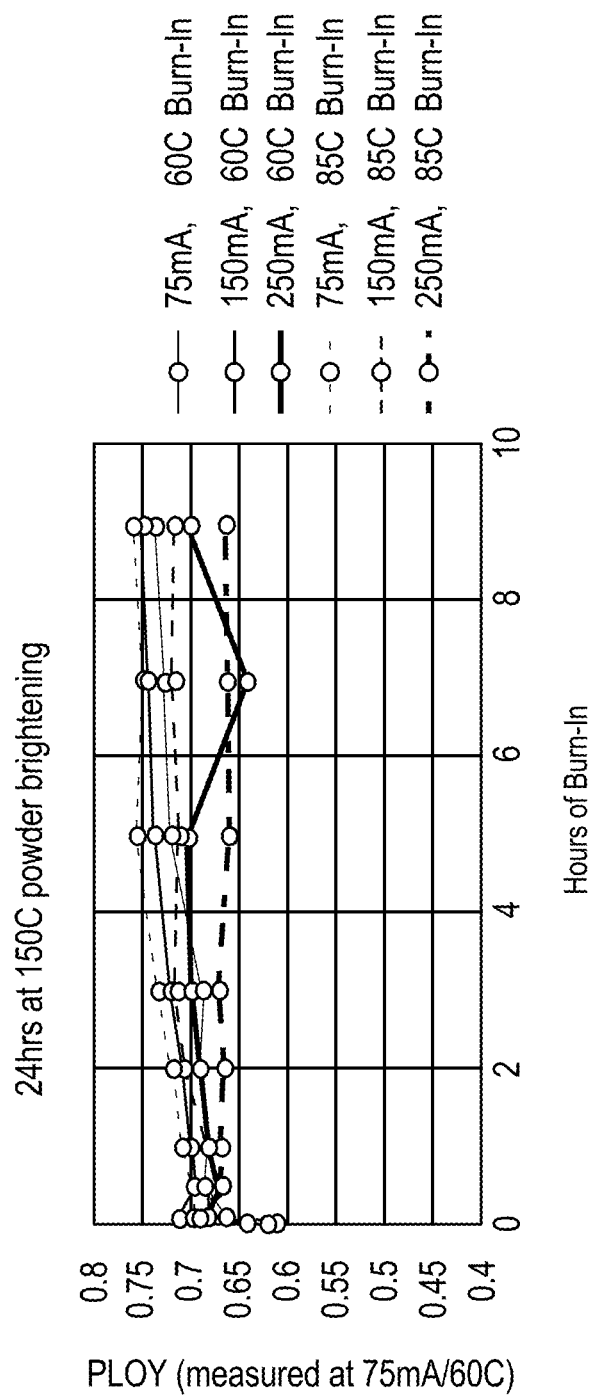
FIG. 10 illustrates quantum dot PLQY stability during LED operation, according to embodiments of the invention.
Figure 11:
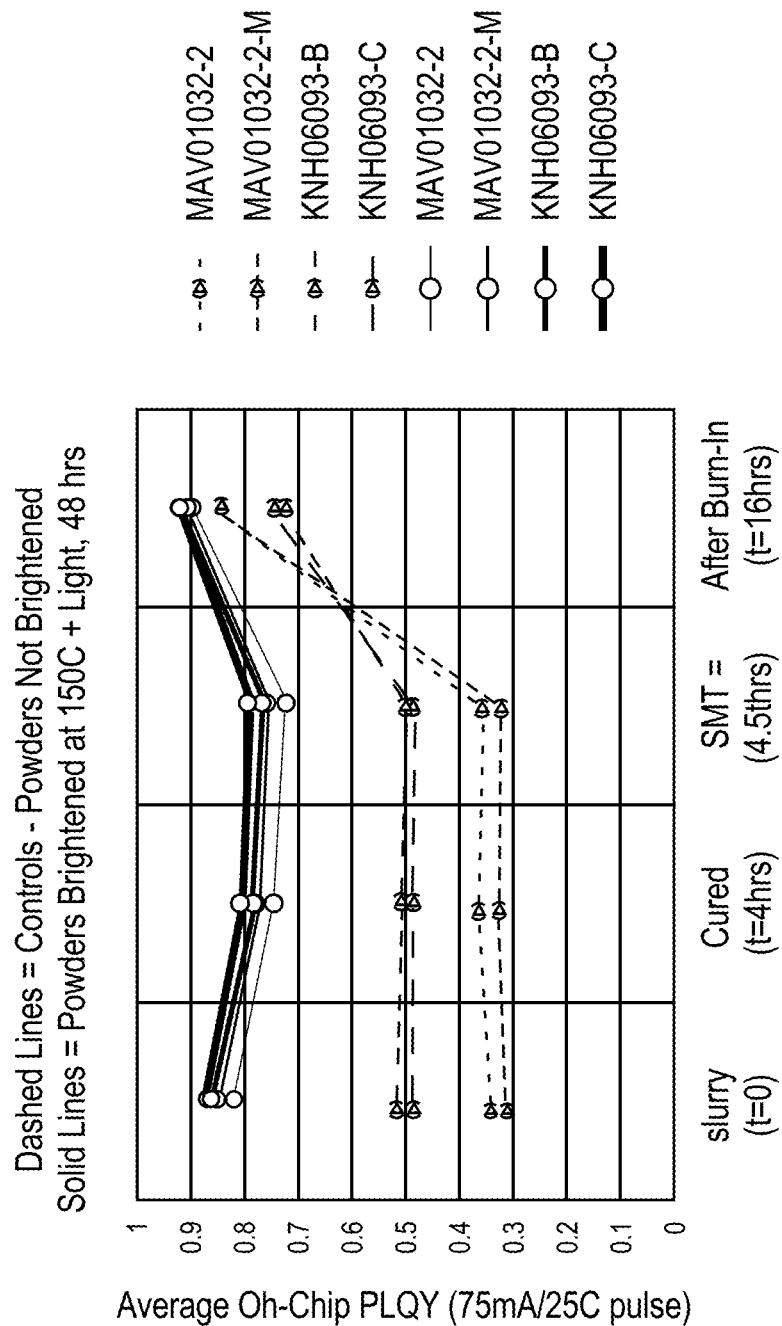
FIG. 11 is a graph of LED device operation showing quantum dot materials that are brightened while in dry powder stage maintain the same QY in a polymer slurry as in LED device operation, in accordance with embodiments of the invention.
Figure 12A:
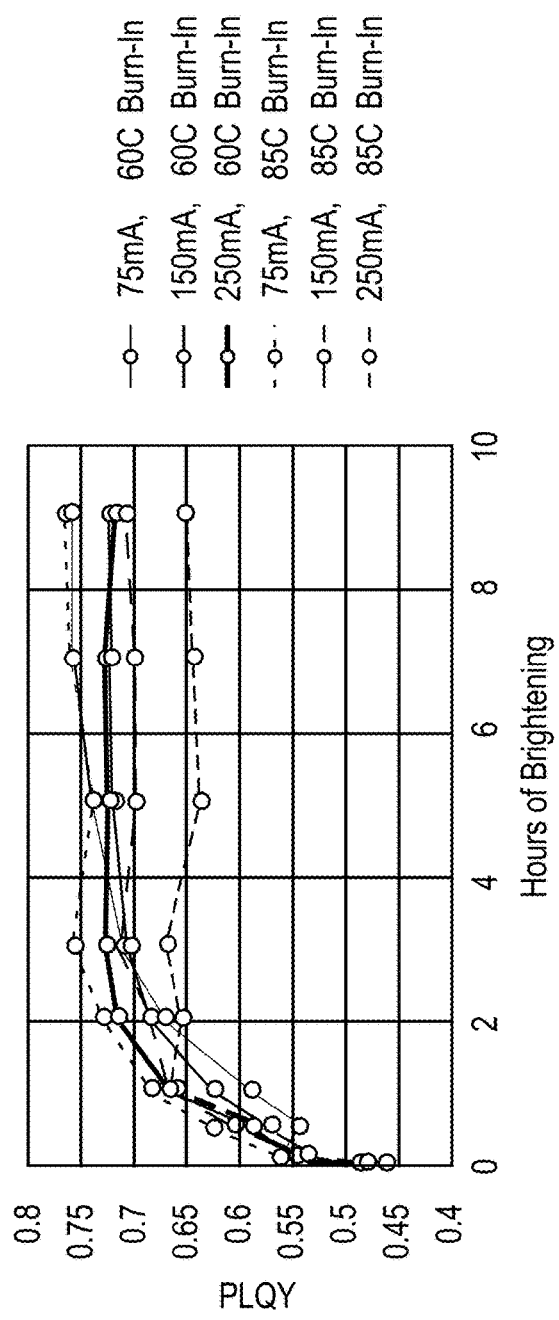
FIG. 12A is a graph of the change in PLQY of quantum dots as they are brightened by "burning in" the LED device.
Figure 12B:
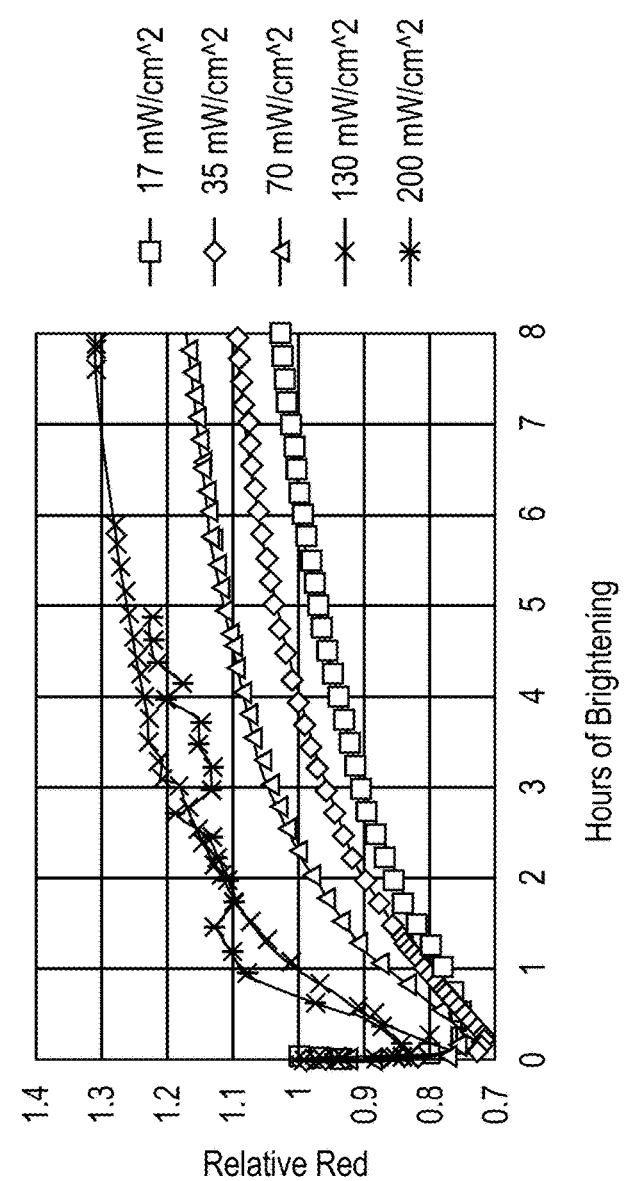
FIG. 12B is a graph of the change in PLQY of powdered quantum dots.

It is appreciated that consistent quantum dot brightening happens when heat and/or light are applied to the QD system for a set period of time. The exact conditions and duration for consistent brightening depend on the needs or requirements of the manufacturing process as well as the final operating conditions of the device. A transfer function can be determined by monitoring the quantum yield and wavelength of the materials throughout the device manufacturing process, and choosing brightening conditions and duration that allow a consistent and constant quantum yield and wavelength during operation. FIG. 9 illustrates correlations and the transfer function for quantum yield when brightening the QDs in the polymer slurry, versus brightening the QDs after curing and surface mounting the LED chips, and after operation of the LED devices ("after burn-in"). The quantum yield of the quantum dots in polymer slurry and after operation in the LED devices are within a few percent of each other when the quantum dots are brightened while in powder form, whereas if the quantum dots are only brightened during burn-in of the LED devices, the quantum yields differ significantly. FIG. 10 illustrates quantum dot PLQY stability during LED operation, according to embodiments of the invention. It can be seen that when the quantum dots while in powder form are brightened, prior to operation, e.g., brightened for 24 hours at 150 C, then the quantum yield performance changes very little once operation begins. For example, FIG. 11 shows that for LED device operation at 75 mA/60 C, quantum dot materials that are brightened while in dry powder stage for 24 hours at 150 C maintain the same QY in the polymer slurry as in LED device operation. FIG. 11 compares brightened versus un-brightened quantum dot materials, wherein brightening happens at the dry powder stage; PLQY is measured at various points post-brightening. Brightening was accomplished using the apparatus in illustrated in FIG. 7, for 48 hours, at a temperature of 150 C, and flux density of 100 mW/cm$^2$.

What is claimed is:

1. A method of increasing photo-luminescent quantum yield (PLQY) of quantum dots (QDs), comprising:
   synthesizing a plurality of quantum dots; and
   applying heat from a heat source and light from a light source different than the heat source, for a duration of time selected from a range from 15 minutes to 100 hours, to the plurality of quantum dots to increase PLQY of the plurality of quantum dots prior to, during, or after further processing, at any point in time between a time that the quantum dot particles are synthesized and a time that a light emitting diode (LED) chip, onto which the QDs are deposited, is first operated.

2. The method of claim 1, further comprising:
   dispensing the plurality of quantum dots onto the Light Emitting Diode (LED) chip; and
   curing the LED chip.

3. The method of claim 2, wherein dispensing the plurality of quantum dots onto the LED chip comprises:
   mixing the plurality of quantum dots into a polymer slurry; and
   dispensing the polymer slurry onto the LED chip.

4. The method of claim 3, wherein applying heat and light to the plurality of quantum dots comprises applying heat and light to the plurality of quantum dots prior to mixing the plurality of quantum dots into the polymer slurry.

5. The method of claim 3, wherein applying heat and light to the plurality of quantum dots comprises applying heat and light to the plurality of quantum dots after mixing the plurality of quantum dots into the polymer slurry.

6. The method of claim 3, wherein applying heat and light to the plurality of quantum dots comprises applying heat and light to the plurality of quantum dots after dispensing the polymer slurry onto the LED chip.

7. The method of claim 3, wherein the polymer slurry comprises a first part and a second part, and wherein mixing the plurality of quantum dots into a polymer slurry comprises:

mixing the plurality of quantum dots into the first part of the polymer slurry; and mixing the plurality of quantum dots mixed with the first part of the polymer slurry into the second part of the polymer slurry.

8. The method of claim 7, wherein applying heat and light to the plurality of quantum dots comprises applying heat and light to the plurality of quantum dots after mixing the plurality of quantum dots into the first part of the polymer slurry but before mixing the plurality of quantum dots mixed with the first part of the polymer slurry into the second part of the polymer slurry.

9. The method of claim 2, further comprising surface mounting the LED chip onto a substrate, and wherein applying heat and light to the plurality of quantum dots to increase PLQY of the plurality of quantum dots comprises applying heat and light to the plurality of quantum dots after surface mounting the LED chip onto the substrate.

10. The method of claim 2, further comprising drying the plurality of quantum dots to produce a plurality of quantum dots in powder form.

11. The method of claim 10, wherein applying heat and light to the plurality of quantum dots to increase PLQY of the plurality of quantum dots comprises applying heat and light to the plurality of quantum dots prior to drying the plurality of quantum dots to produce a plurality of quantum dots in powder form.

12. The method of claim 10, wherein dispensing the plurality of quantum dots onto the LED chip comprises:

mixing the plurality of quantum dots in powder form into a polymer slurry; and dispensing the polymer slurry onto the LED chip.

13. The method of claim 12, wherein applying heat and light to the plurality of quantum dots comprises applying heat and light to the plurality of quantum dots in powder form prior to mixing the plurality of quantum dots in powder form into the polymer slurry.

14. The method of claim 12, wherein applying heat and light to the plurality of quantum dots comprises applying heat and light to the plurality of quantum dots after mixing the plurality of quantum dots in powder form into the polymer slurry.

15. The method of claim 12, wherein applying heat and light to the plurality of quantum dots comprises applying heat and light to the plurality of quantum dots after dispensing the polymer slurry onto the LED chip.

16. The method of claim 12, wherein the polymer slurry comprises a first part and a second part, and wherein mixing the plurality of quantum dots in powder form into a polymer slurry comprises:

mixing the plurality of quantum dots in powder form into the first part of the polymer slurry; and mixing the plurality of quantum dots in powder form mixed with the first part of the polymer slurry into the second part of the polymer slurry.

17. The method of claim 16, wherein applying heat and light to the plurality of quantum dots comprises applying heat and light to the plurality of quantum dots in powder form after mixing the plurality of quantum dots in powder form into the first part of the polymer slurry but before mixing the plurality of quantum dots in powder form mixed with the first part of the polymer slurry into the second part of the polymer slurry.

18. The method of claim 10, further comprising surface mounting the LED chip onto a substrate, and wherein applying heat and light to the plurality of quantum dots to increase PLQY of the plurality of quantum dots comprises applying heat and light to the plurality of quantum dots after surface mounting the LED chip onto the substrate.

19. A method of increasing photo-luminescent quantum yield (PLQY) of quantum dots (QDs), comprising:

synthesizing a plurality of quantum dots;

applying heat from a heat source and light from a light source different than the heat source, for a duration of time selected from a range from 15 minutes to 100 hours, to the plurality of quantum dots to increase the PLQY of the plurality of quantum dots prior to, during, or after further processing;

dispensing the plurality of quantum dots onto a Light Emitting Diode (LED) chip comprising:

mixing the plurality of quantum dots into a first part of a polymer slurry;

mixing the plurality of quantum dots mixed with the first part of the polymer slurry into a second part of the polymer slurry; and dispensing the polymer slurry onto the LED chip; and curing the LED chip.

* * * * *